(12) United States Patent
Enzmann et al.

(10) Patent No.: US 11,195,974 B2
(45) Date of Patent: Dec. 7, 2021

(54) SEMICONDUCTOR CHIPS AND METHOD FOR PRODUCING SEMICONDUCTOR CHIPS

(71) Applicant: OSRAM OLED GmbH, Regensburg (DE)

(72) Inventors: Roland Heinrich Enzmann, Penang (MY); Lorenzo Zini, Regensburg (DE); Vanessa Eichinger, Wenzenbach (DE); Jochen Brendt, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 59 days.

(21) Appl. No.: 16/753,808

(22) PCT Filed: Sep. 25, 2018

(86) PCT No.: PCT/EP2018/076012
§ 371 (c)(1),
(2) Date: Apr. 6, 2020

(87) PCT Pub. No.: WO2019/068522
PCT Pub. Date: Apr. 11, 2019

(65) Prior Publication Data
US 2020/0287089 A1 Sep. 10, 2020

(30) Foreign Application Priority Data
Oct. 6, 2017 (DE) .................. 10 2017 123 242.7

(51) Int. Cl.
*H01L 33/38* (2010.01)
*H01L 33/14* (2010.01)
*H01L 33/62* (2010.01)

(52) U.S. Cl.
CPC ............ *H01L 33/382* (2013.01); *H01L 33/14* (2013.01); *H01L 33/62* (2013.01); *H01L 2933/0016* (2013.01); *H01L 2933/0025* (2013.01)

(58) Field of Classification Search
CPC ....... H01L 33/44; H01L 33/14; H01L 33/382; H01L 2933/0016; H01L 33/0095;
(Continued)

(56) References Cited

U.S. PATENT DOCUMENTS 10,236,419 B2 * 3/2019 Hoeppel ............... H01L 33/60
10,546,987 B2 * 1/2020 Moosburger .......... H01L 33/486
(Continued)

FOREIGN PATENT DOCUMENTS

DE 102010009717 A1 9/2011
DE 102010025320 A1 12/2011
(Continued)

OTHER PUBLICATIONS

International Search Report issued for the counterpart international application No. PCT/EP2018/076012, dated Dec. 7, 2018, 4 pages (for reference purpose only).
(Continued)

*Primary Examiner* — Savitri Mulpuri
(74) *Attorney, Agent, or Firm* — Viering, Jentschura & Partner mbB

(57) ABSTRACT

A semiconductor chip may include a substrate and a semiconductor body positioned thereon. The semiconductor body has a first semiconductor layer and a second semiconductor layer with an active zone sandwiched therebetween. At least one current spreading layer is designed to electrically contact the first semiconductor layer positioned between the substrate and the semiconductor body. A metal layer is designed to electrically contact the second semicon-
(Continued)

ductor layer positioned between the substrate and the current spreading layer where the metal layer fully covers the current spreading layer. An insulating layer may be positioned between the current spreading layer and the metal layer in the vertical direction to where the metal layer is electrically insulated from the current spreading layer.

15 Claims, 12 Drawing Sheets

(58) Field of Classification Search
CPC .......... H01L 2933/0025; H01L 33/505; H01L 33/486; H01L 33/60; H01L 33/62; H01L 33/405; H01L 2933/0066; H01L 2933/0041

See application file for complete search history.

(56) References Cited

U.S. PATENT DOCUMENTS

| | | | | |
|---|---|---|---|---|
| 10,629,781 | B2 * | 4/2020 | Moosburger | H01L 33/486 |
| 11,063,182 | B2 * | 7/2021 | Sundgren | H01L 33/145 |
| 2012/0007101 | A1 | 1/2012 | Yang et al. | |
| 2013/0146910 | A1 | 6/2013 | Maute et al. | |
| 2013/0187192 | A1 * | 7/2013 | Hoeppel | H01L 31/18 257/99 |
| 2014/0021507 | A1 | 1/2014 | Engl et al. | |
| 2014/0319547 | A1 | 10/2014 | Rode et al. | |
| 2015/0236209 | A1 * | 8/2015 | Pfeuffer | H01L 33/20 257/99 |
| 2015/0270458 | A1 | 9/2015 | Hoeppel et al. | |
| 2016/0351758 | A1 * | 12/2016 | Herrmann | H01L 33/505 |
| 2018/0358509 | A1 | 12/2018 | Huppmann et al. | |

FOREIGN PATENT DOCUMENTS

| | | |
|---|---|---|
| DE | 102011011140 A1 | 8/2012 |
| DE | 102012101409 A1 | 6/2013 |
| DE | 102012108879 A1 | 3/2014 |
| EP | 2725629 A2 | 4/2014 |
| WO | 2017093327 A1 | 6/2017 |

OTHER PUBLICATIONS

Search Report issued for the counterpart German application No. 10 2017 123 242.7, dated Jun. 15, 2018, 8 pages (for reference purpose only).

* cited by examiner

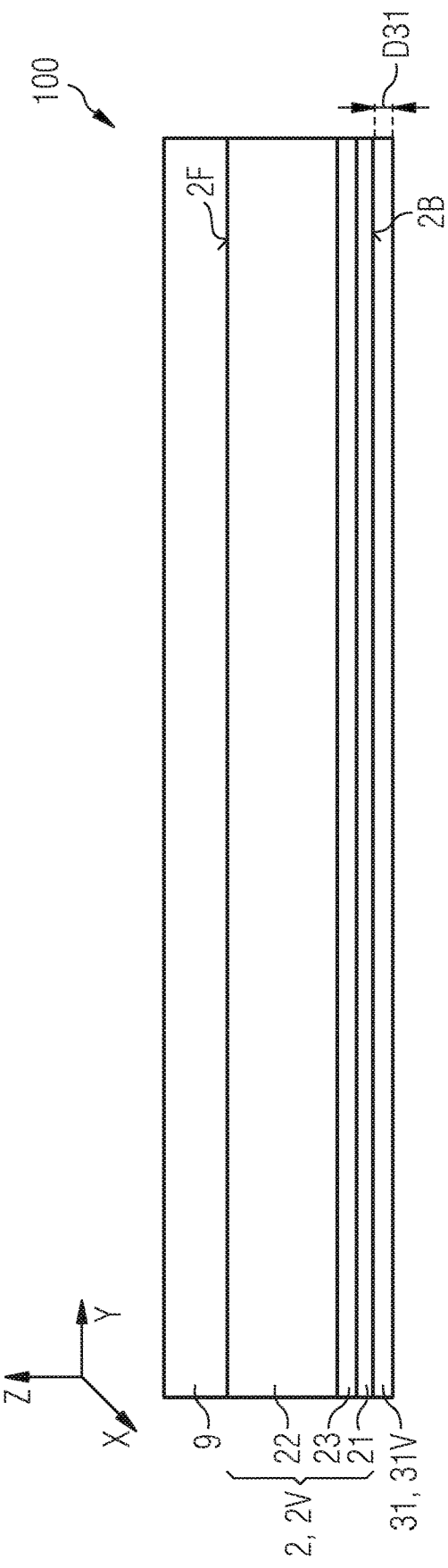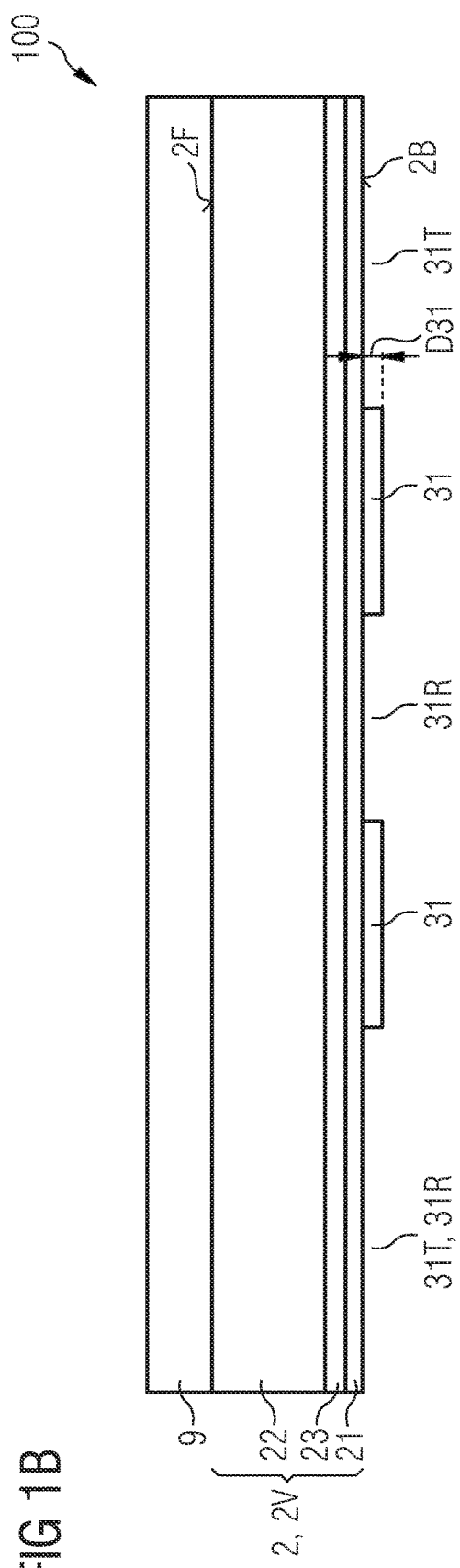

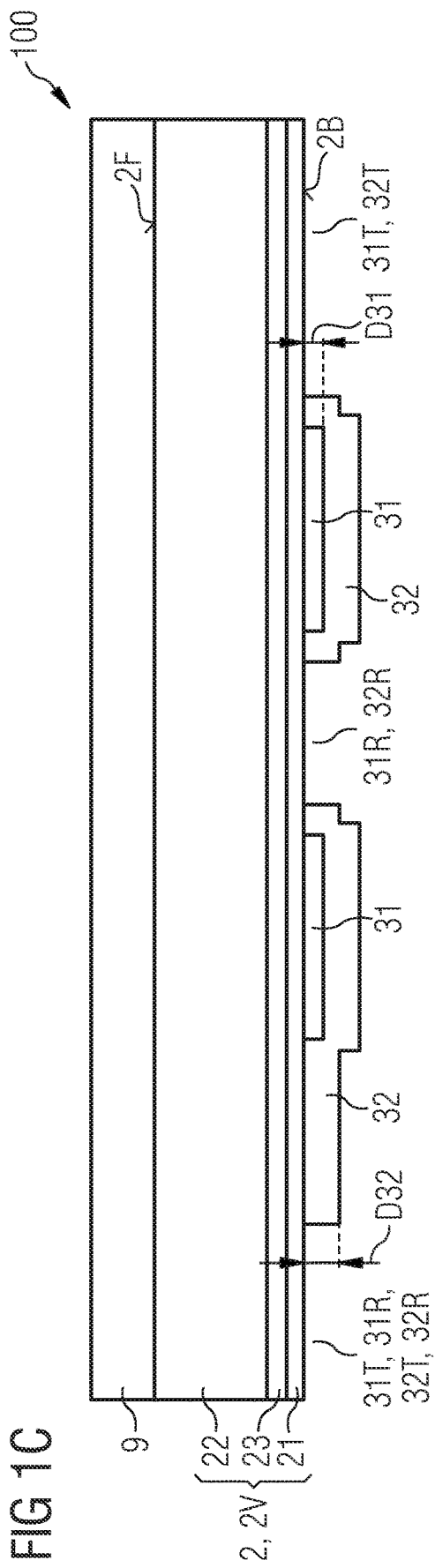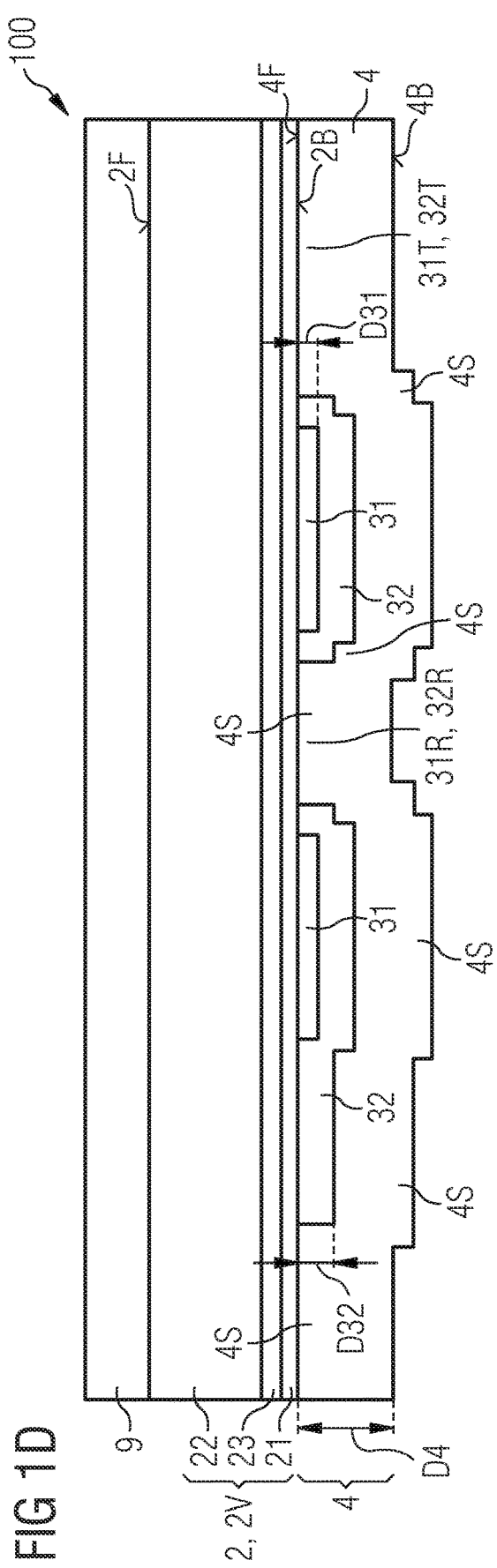

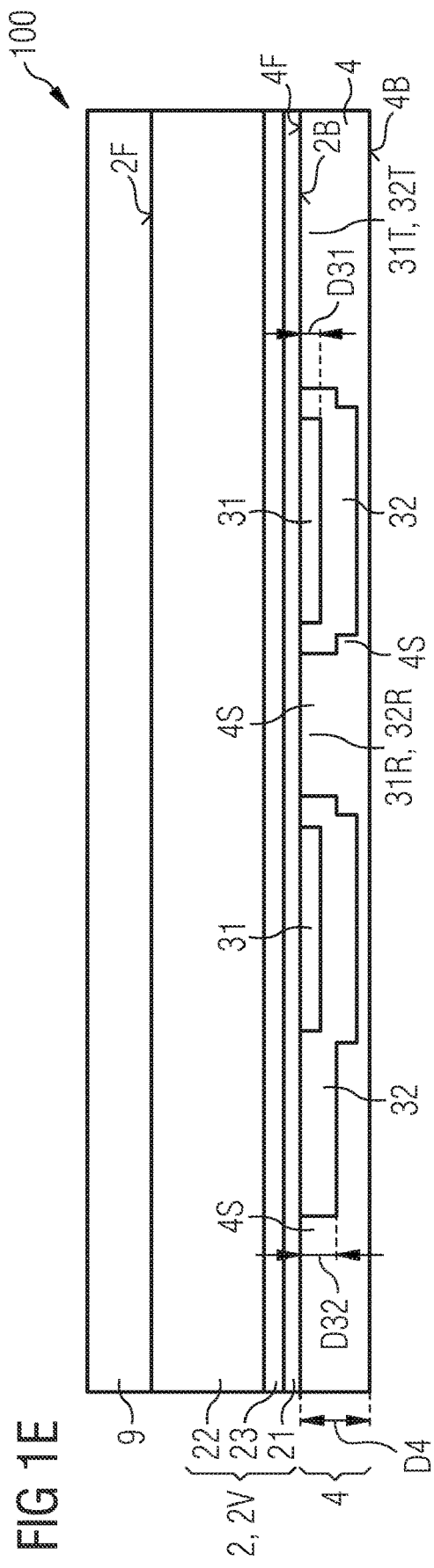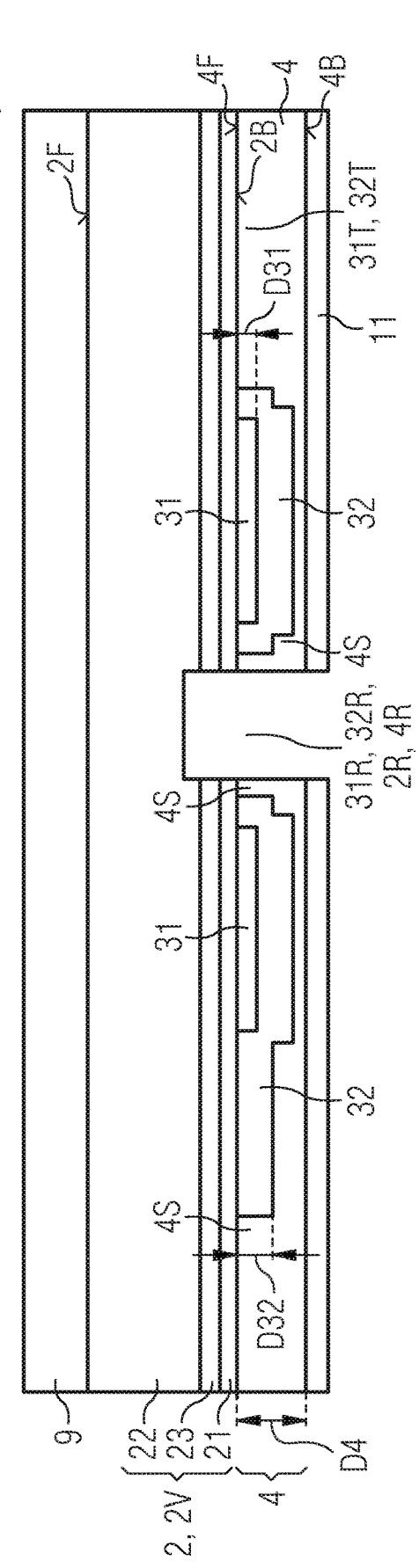

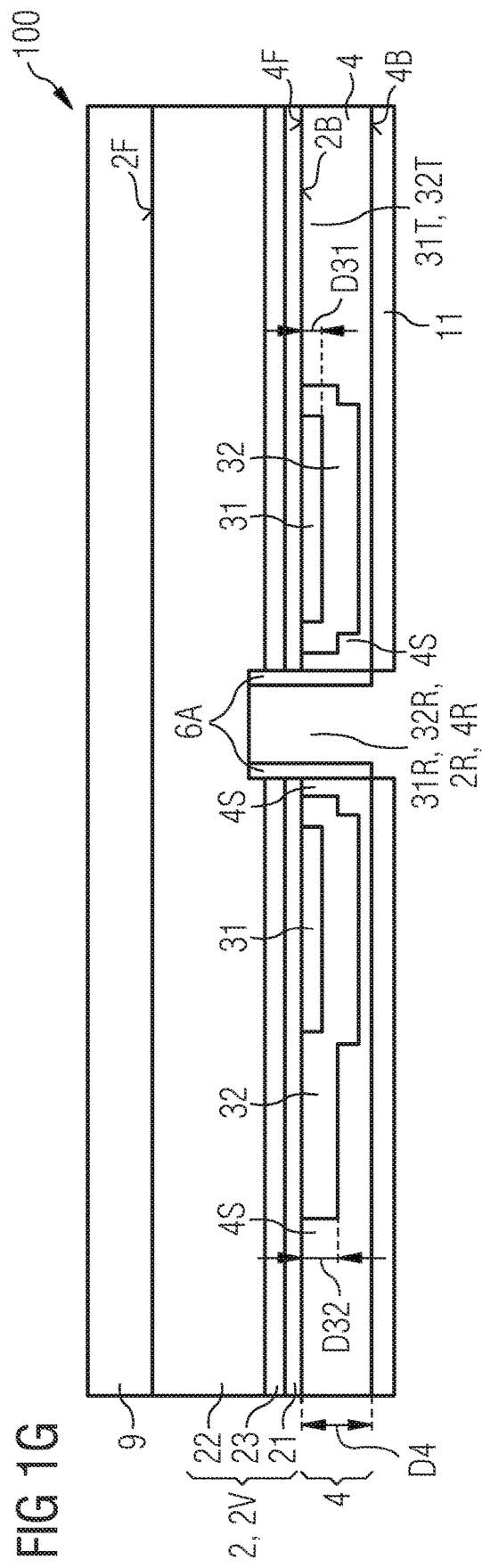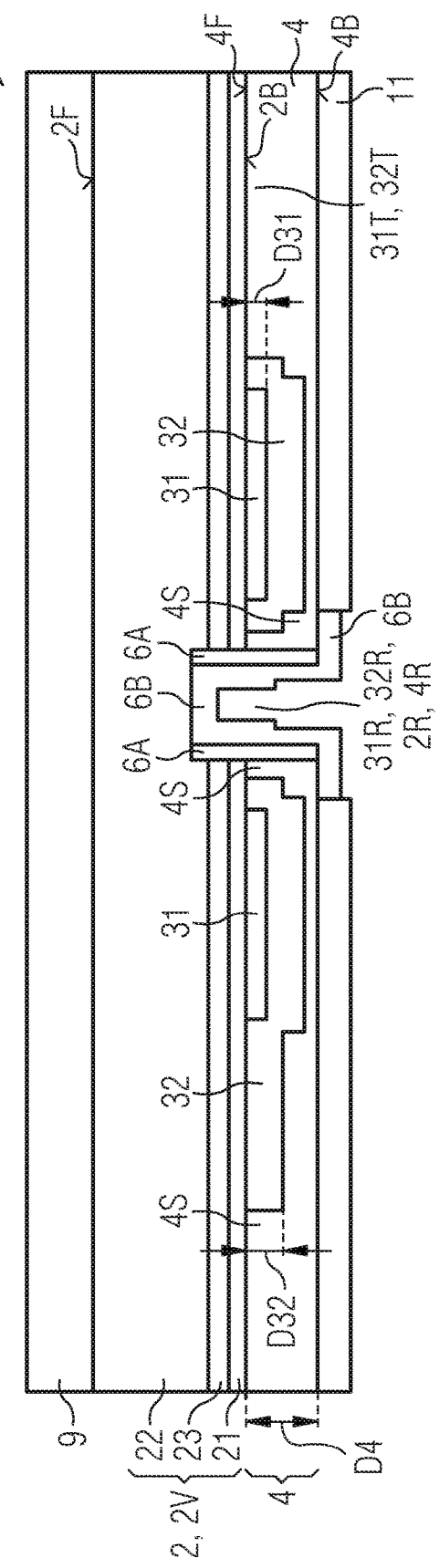

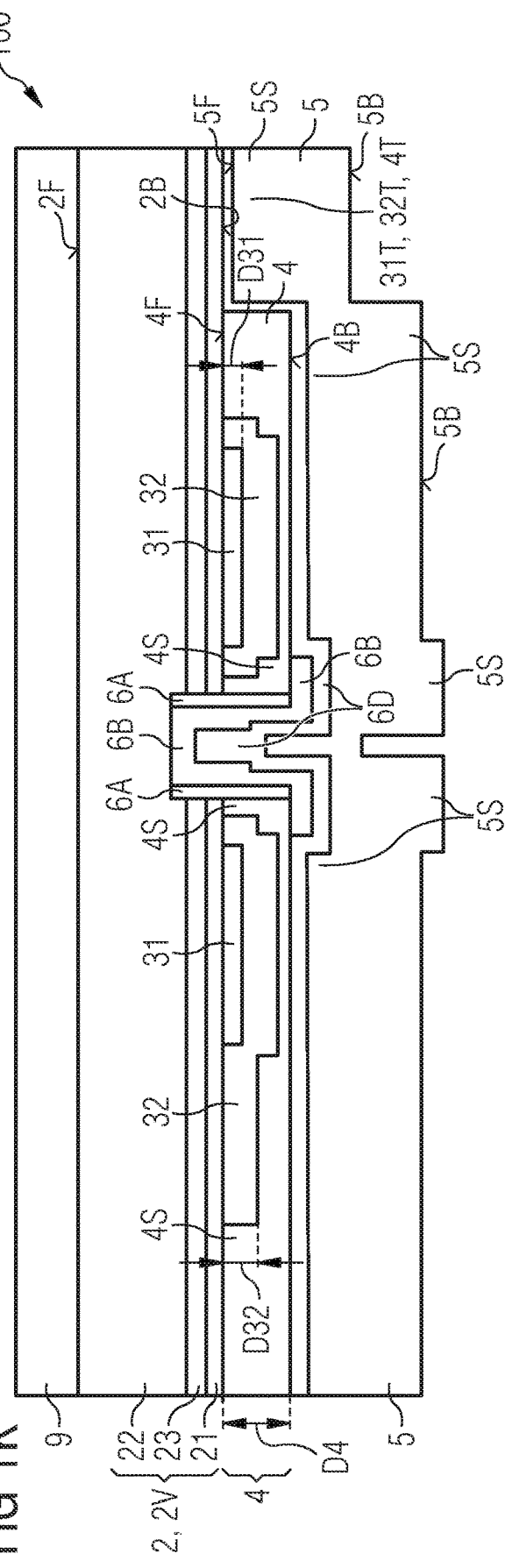
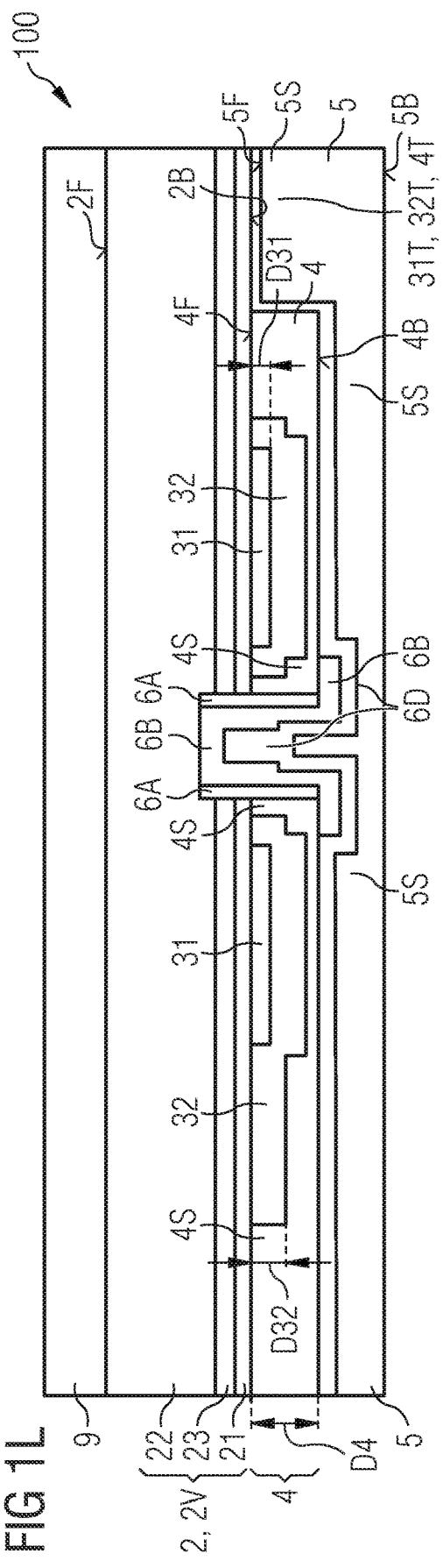

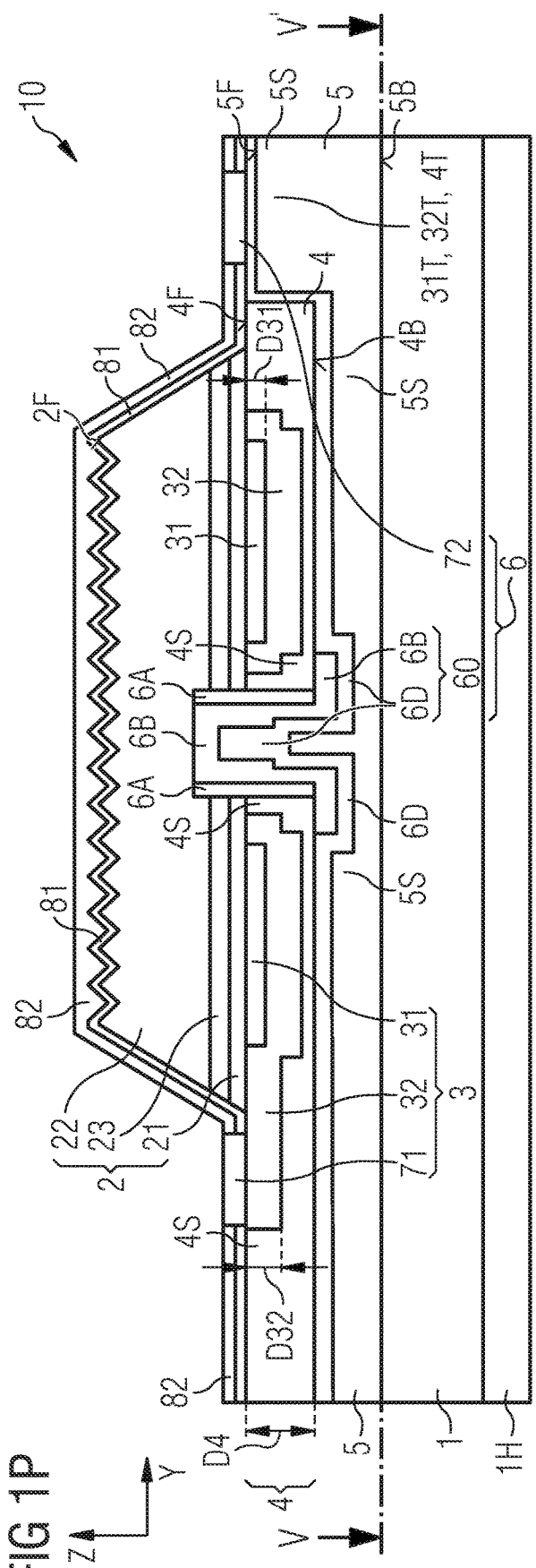
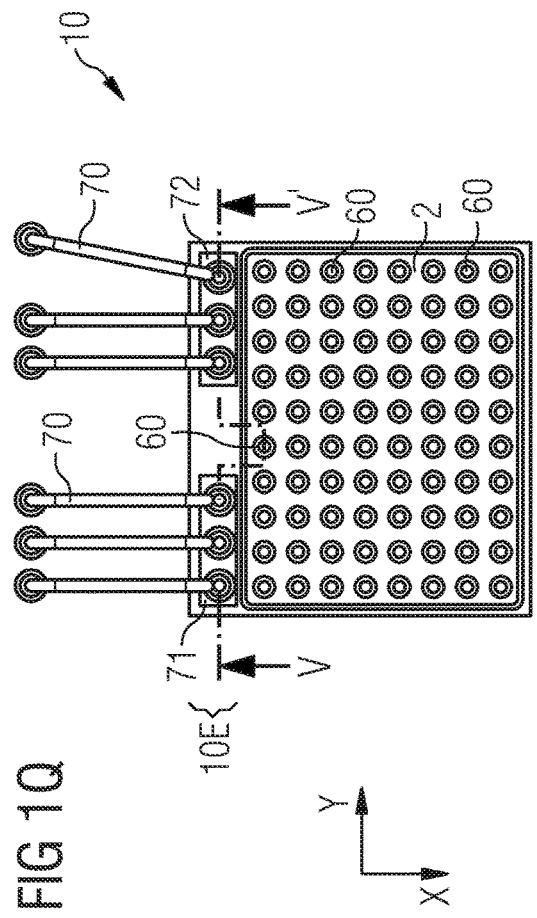
FIG 1P
FIG 1Q

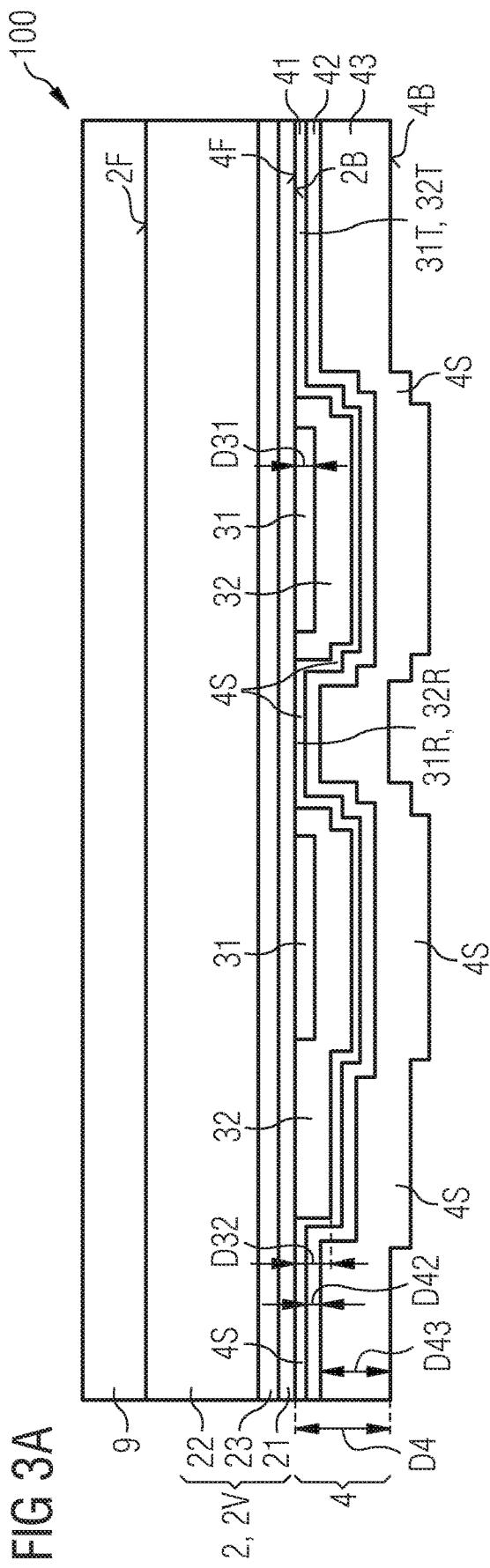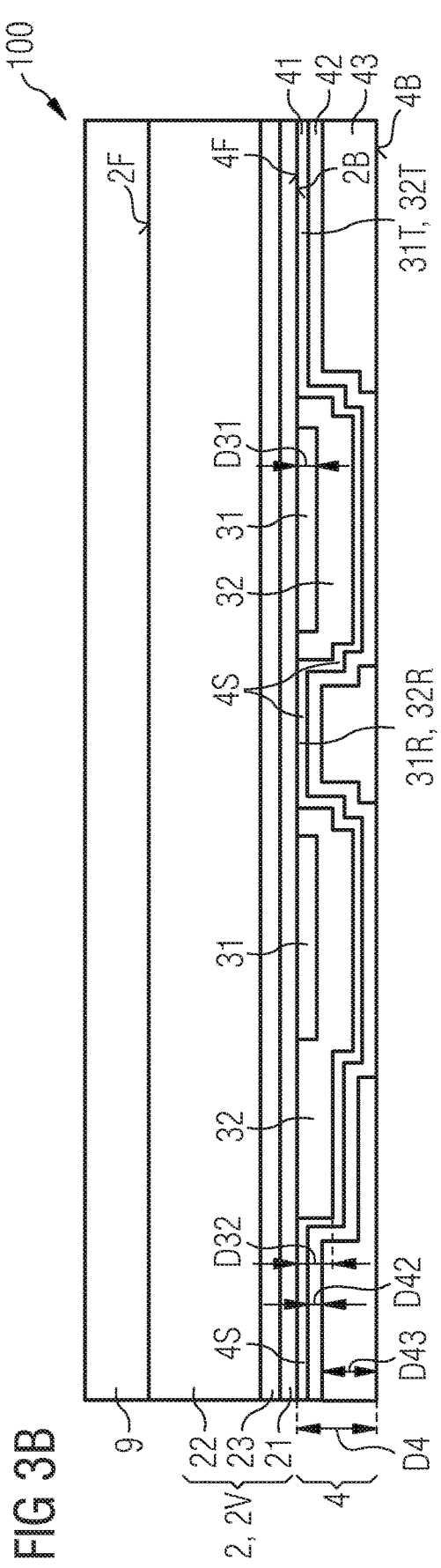

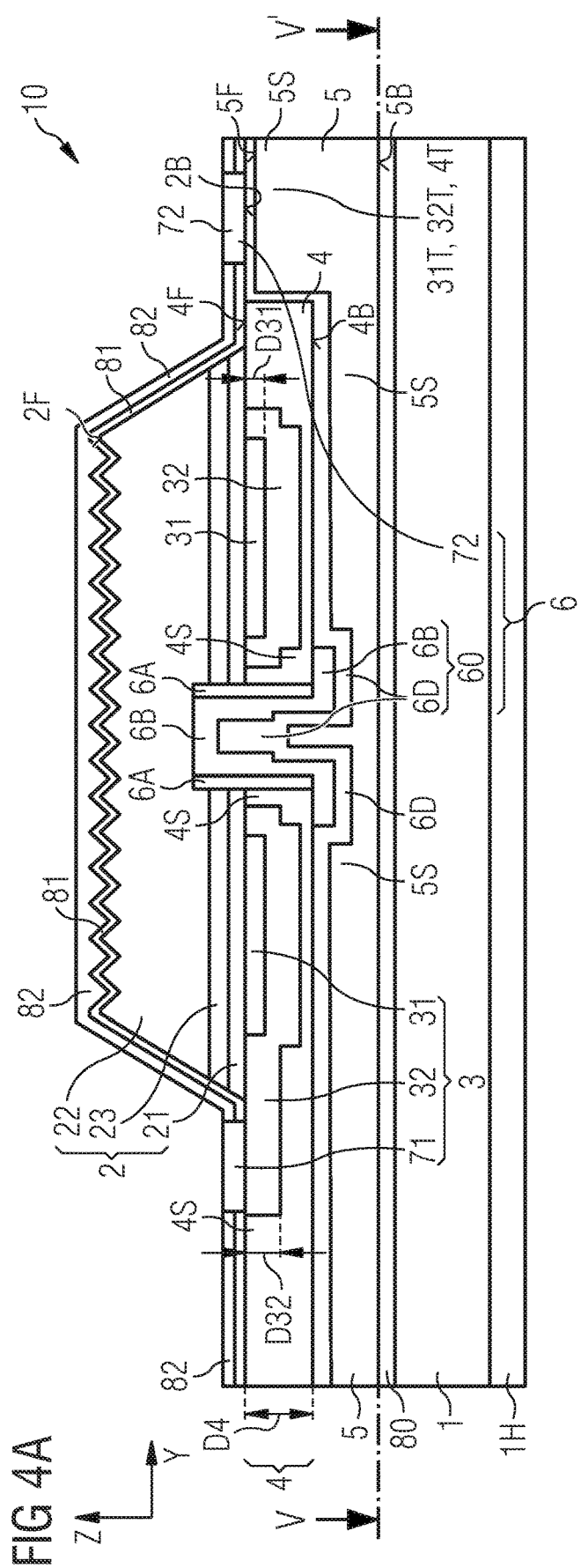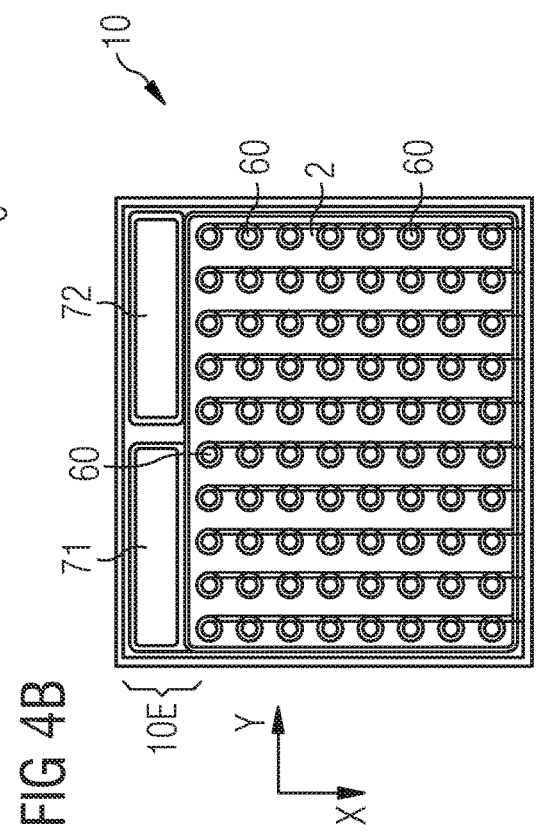

SEMICONDUCTOR CHIPS AND METHOD FOR PRODUCING SEMICONDUCTOR CHIPS

CROSS-REFERENCE TO RELATED APPLICATIONS

The present application is a national stage entry according to 35 U.S.C. § 371 of PCT application No.: PCT/EP2018/076012 filed on Sep. 25, 2018; which claims priority to German Patent Application Ser. No.: 10 2017 123 242.7, which was filed on Oct. 6, 2017; which are incorporated herein by reference in their entirety and for all purposes.

TECHNICAL FIELD

A semiconductor chip is provided. A method for producing one or a multiplicity of semiconductor chips is furthermore provided.

BACKGROUND

For a reliable high-current semiconductor chip with at the same time a low forward voltage, it is expedient to make current spreading layers for electrical contacting of a semiconductor body of the semiconductor chip sufficiently thick in order to achieve maximally homogeneous current distribution in the semiconductor chip. The relatively thick current spreading layers, however, lead to the formation of steps that are molded over by further layers of the semiconductor chip. The step overmolding may lead to weak points in the reliability of the semiconductor chip, for instance in the event of moisture deposition in the semiconductor chip. The steps may furthermore lead to bending of a semiconductor wafer, particularly if the semiconductor wafer is mechanically connected to an external carrier, so that further processing steps in the manufacture of the semiconductor chip or the multiplicity of semiconductor chips may be made more difficult.

SUMMARY

It is an object to provide a simplified and reliable method for producing one or a multiplicity of semiconductor chips. A compact semiconductor chip, for instance a compact high-current semiconductor chip, having increased mechanical stability is furthermore provided.

According to at least one embodiment of a method for producing one or a multiplicity of semiconductor chips, a semiconductor body or a semiconductor body panel is provided. The semiconductor body panel is, for example, configured to be continuous. For example, the semiconductor body or the semiconductor body panel is arranged on a growth substrate or epitaxially grown. The semiconductor body panel may be divided into a multiplicity of semiconductor bodies. In particular, each of the semiconductor bodies is formed by an LED structure.

In particular, the semiconductor body or the semiconductor body panel comprises a first semiconductor layer, a second semiconductor layer and an active zone lying between them. The active zone may be adapted for generation or detection of electromagnetic radiation, for instance in the visible, ultraviolet or infrared spectral range. The first semiconductor layer, the second semiconductor layer and the active zone may respectively comprise one or a multiplicity of doped or undoped layers. For example, the semiconductor body or the semiconductor body panel comprises or is based on a III-V or a II-VI compound semiconductor material. For example, the semiconductor body or the semiconductor body panel is based on GaN.

According to at least one embodiment of the method, a current spreading layer or a multiplicity of current spreading layers for electrical contacting of the semiconductor body, in particular of the first p-side semiconductor layer of the semiconductor body, are formed. For example, each semiconductor body is assigned a current spreading layer, in which case the semiconductor body may fully cover the current spreading layer assigned to it in a plan view. For example, a multiplicity of laterally separated current spreading layers may be formed on the semiconductor body panel. The laterally separated current spreading layers may be applied in a structured fashion onto the semiconductor body panel. As an alternative, it is possible first to form a continuous current spreading layer panel on the semiconductor body panel and to structure the current spreading layer panel in a subsequent method step to form a multiplicity of current spreading layers.

In a non-limiting embodiment, the current spreading layer has a vertical layer thickness of at least 500 nm, 700 nm, 900 nm or 1 µm, 1.5 µm or at least 2 µm. For example, the vertical layer thickness of the current spreading layer is between 500 nm and 5 µm inclusive, between 500 nm and 3 µm inclusive or between 500 nm and 2 µm inclusive. It has been found that an operating junction temperature of the semiconductor body at a layer thickness of the current spreading layer of more than 500 nm can be reduced to 10° C. with an increasing layer thickness. In particular, the current spreading layer adjoins a p-side semiconductor layer of the semiconductor body in regions.

The current spreading layer and/or a terminal layer which for instance is arranged between the semiconductor body and the current spreading layer, may cover at least 30%, 40%, 50%, 60%, 70% or at least 80% of a surface, facing toward the current spreading layer, of the associated semiconductor body, for instance between 30% and 95% inclusive. The current spreading layer may fully cover a terminal layer assigned to it and/or protrude laterally beyond the terminal layer. The current spreading layer may in regions adjoin, for instance directly adjoin, the semiconductor body, for instance the p-side semiconductor layer of the semiconductor body, and/or the terminal layer.

In comparison with an n-side semiconductor layer, the p-side semiconductor layer generally has a lower transverse conductivity. By such a configuration of the current spreading layer, which for instance is adapted for electrical contacting of the p-side semiconductor layer, reliable and uniform current delivery into the semiconductor chip may be achieved. In particular, the semiconductor chip is a high-current semiconductor chip, which during normal operation has a current density of at least 4 A/mm$^2$, 5 A/mm$^2$, 6 A/mm$^2$, 8 A/mm$^2$ or at least 10 A/mm$^2$, for instance between 4 A/mm$^2$ and 15 A/mm$^2$ inclusive. Such a semiconductor chip may have a forward voltage of 4.5 V+/−2 V.

A vertical direction is intended to mean a direction which is directed in particular perpendicularly to a main extent surface of the semiconductor body and/or of the active zone. For example, the vertical direction is directed parallel to a growth direction of the semiconductor layers of the semiconductor body. A lateral direction is intended to mean a direction which extends, in particular, parallel to the main extent surface. The vertical direction and the lateral direction are, for instance, orthogonal to one another.

According to at least one embodiment of the method, an insulation layer is formed, which covers the current spreading layer or the current spreading layers, or all the current spreading layers, in particular fully. The insulation layer may be configured to be continuous. The current spreading layer or the multiplicity of current spreading layers are overmolded by the insulation layer, in particular in such a way that the insulation layer comprises a front-side and/or a back-side surface, in which case the front-side and/or a back-side surface of the insulation layer may replicate a contour of the current spreading layer or of the current spreading layers. In this case, the insulation layer may adjoin the current spreading layer or the current spreading layers, in particular directly. It is also possible for at least one further layer to be arranged in the vertical direction between the insulation layer and the current spreading layer or the current spreading layers.

According to at least one embodiment of the method, a metal layer is formed on the insulation layer. The metal layer is in particular adapted for electrical contacting of the second, for instance n-side semiconductor layer. The metal layer may cover the current spreading layer or the current spreading layers, or all the current spreading layers, in particular fully. The insulation layer is located in the vertical direction, for instance, between the metal layer and the current spreading layer or the current spreading layers, so that the metal layer is electrically insulated by the insulation layer from the current spreading layer or from the current spreading layers. In the vertical direction, the terminal layer or the current spreading layer is arranged between the associated semiconductor body and the metal layer.

According to at least one embodiment of the method, a surface, facing away from or facing towards the semiconductor body, of the insulation layer and/or of the metal layer initially has steps after formation on the semiconductor body. The insulation layer and/or the metal layer may be applied onto the semiconductor body or onto the semiconductor body panel by means of a coating method. Except for the overmolding edges, the insulation layer and/or the metal layer may have a constant vertical layer thickness along a lateral direction within the scope of production tolerances.

On the overmolding edges, the surface, facing away from the semiconductor body, of the insulation layer and/or of the metal layer may comprise vertical steps, which may be leveled or planarized in a subsequent method step. In particular, the surface, facing away from the semiconductor body, of the insulation layer and/or of the metal layer is planarized, for instance, by means of a chemical-mechanical planarization process. The planarized surface may have an average roughness which is at most 300 nm, 200 nm, 100 nm, 50 nm, 30 nm, 20 nm or at most 10 nm, for instance between 3 nm and 300 nm inclusive. With a leveled or planarized surface of the insulation layer and/or of the metal layer, further processing steps in the manufacture of the semiconductor chip or of the multiplicity of semiconductor chips may be carried out in a simplified way.

In at least one method for the production of a semiconductor chip, a semiconductor body having a first semiconductor layer, a second semiconductor layer and an active zone lying between them is provided. A current spreading layer for electrical contacting of the first semiconductor layer is formed, the current spreading layer having a vertical layer thickness of at least 500 nm. An insulation layer, which fully covers the current spreading layer, is formed. A metal layer, which is adapted for electrical contacting of the second semiconductor layer, is formed, the metal layer fully covering the current spreading layer. The insulation layer is arranged in the vertical direction in particular between the metal layer and the current spreading layer, so that the metal layer is electrically insulated from the current spreading layer. A surface, facing away from the semiconductor body, of the insulation layer and/or a surface, facing away from the semiconductor body, of the metal layer may initially have steps, which are subsequently leveled, such as planarized.

According to at least one method for producing a multiplicity of semiconductor chips, a continuous semiconductor body panel, which can be divided into a multiplicity of semiconductor bodies, is provided. A multiplicity of the current spreading layers is formed in such a way that the current spreading layers are laterally separated from one another. In particular, the current spreading layers are respectively assigned to a or precisely one semiconductor body of the semiconductor chips to be produced. The insulation layer may be configured to be continuous, in such a way that it covers, for instance fully covers, all the current spreading layers. The metal layer may be configured in such a way that it covers, in particular fully covers, all the current spreading layers. The metal layer may be electrically insulated from the current spreading layers by the insulation layer. For example, the method layer is configured to be continuous. It is possible for the metal layer to comprise a multiplicity of sublayers, the sublayers respectively covering at least one of the current spreading layers, in particular fully. The surface, facing away from the semiconductor body panel, of the insulation layer and/or the surface, facing away from the semiconductor body panel, of the metal layer may be levelled or planarized before the division of the semiconductor body panel into a multiplicity of semiconductor bodies.

According to at least one method, the surface, facing away from the semiconductor body, of the insulation layer and/or the surface, facing away from the semiconductor body, of the metal layer may be leveled by means of a chemical-mechanical planarization process. The surface, facing toward the semiconductor body, of the insulation layer and/or of the metal layer may comprise vertical steps, which have in particular a vertical height of at least 200 nm, 300 nm, 500 nm, 700 nm, 900 nm or 1 µm, 1.5 µm or of at least 2 µm, for example between 200 nm and 4 µm inclusive. In this sense, the insulation layer and/or the metal layer acts/act as planarization layers for the semiconductor chips to be produced.

According to at least one method, the insulation layer comprises one sublayer and a further sublayer. For example, the sublayer is arranged in the vertical direction between the semiconductor body and the further sublayer. The sublayer and the further sublayer are configured in respect of their material composition in such a way that the sublayer is configured to be more etching-resistant and/or more polishing-resistant than the further sublayer. It is possible for the insulation layer to comprise a plurality of sublayers and/or further sublayers. In a non-limiting embodiment, the sublayer is formed from a material which is based on a nitride. The further sublayer may be formed from a further material which is based on an oxide.

According to at least one method, the surface, facing away from the semiconductor body, of the metal layer is planarized in such a way that it is configured to be globally level. For example, the surface of the metal layer has a roughness, for instance an average roughness, of at most 30 nm, 20 nm, 10 nm, 5 nm or at most 3 nm. The average roughness may be between 3 nm and 300 nm inclusive, between 3 nm and 100 nm inclusive, or between 3 nm and 50 nm inclusive. The metal layer may be mechanically connected on its planarized surface to a carrier or to a carrier panel by means of a direct bonding method. As an alternative, it is possible for the metal layer to be mechanically connected on its planarized surface to a carrier or to a carrier panel by means of a connecting layer.

A direct bonding method is intended, in particular, to mean a method in which two bodies, each of which has a planar surface, are brought together at a suitable pressure and a suitable temperature, for instance at a temperature of less than 150° C., and are mechanically connected to one another because of Van der Waals interactions or hydrogen bonds between the atoms on the planar surfaces. A connecting layer between the two bodies may thus be omitted.

According to at least one method, the surface, facing away from the semiconductor body, of the insulation layer is planarized in such a way that it is configured to be globally level. For example, the surface of the insulation layer has a roughness, for instance an average roughness, of at most 30 nm, 20 nm, 10 nm, 5 nm or at most 3 nm. The average roughness may be between 3 nm and 300 nm inclusive, between 3 nm and 100 nm inclusive, or between 3 nm and 50 nm inclusive.

In at least one embodiment of a semiconductor chip, it comprises a carrier and a semiconductor body arranged thereon. The semiconductor body comprises a first semiconductor layer facing toward the carrier, a second semiconductor layer facing away from the carrier and an active zone lying between them. In particular, at least one current spreading layer is arranged between the carrier and the semiconductor body, the current spreading layer being adapted for electrical contacting of the first semiconductor layer. In a non-limiting embodiment, the current spreading layer has a vertical layer thickness of at least 500 nm. A metal layer adapted for electrical contacting of the second semiconductor layer may be arranged between the carrier and the current spreading layer, the metal layer covering the current spreading layer, in particular fully. An insulation layer is arranged in the vertical direction between the current spreading layer and the metal layer, the insulation layer fully covering the current spreading layer and electrically insulating the metal layer from the current spreading layer. In particular, the insulation layer or the metal layer comprises a planarized surface facing away from the semiconductor body.

The method described above is suitable for the production of one or a multiplicity of the semiconductor chips described above. Features described in connection with the semiconductor chip may therefore be also used for the method, and vice versa.

According to at least one embodiment of the method or of the semiconductor chip, the insulation layer and/or the metal layer comprise/comprises a surface, facing toward the semiconductor body, having local vertical elevations or depressions. The surface, facing toward the semiconductor body, of the insulation layer and/or of the metal layer may thus comprise vertical steps.

According to at least one embodiment of the method or of the semiconductor chip, a through-contact for electrical contacting of the second semiconductor layer is configured in such a way that it is electrically connected to the metal layer and extends through the first semiconductor layer and the active zone into the second semiconductor layer. In the lateral directions, the through-contact may be fully enclosed by the semiconductor body. The semiconductor body may comprise a multiplicity of such through-contacts, for instance more than 3, 6, 10 or more than 20 through-contacts.

According to at least one embodiment of the method or of the semiconductor chip, each semiconductor body is assigned a multiplicity of through-contacts, which in particular are electrically connected to one another by means of the metal layer. The metal layer is configured to be continuous.

According to at least one embodiment of the method or of the semiconductor chip, the current spreading layer is arranged between the terminal layer and the insulation layer, the current spreading layer being in electrical contact with the terminal layer and covering the terminal layer, in particular fully. The terminal layer may adjoin, in particular directly adjoin, the semiconductor body and/or the current spreading layer. The terminal layer has a smaller vertical layer thickness than the current spreading layer. For example, the vertical layer thickness of the terminal layer is between 10 nm and 1000 nm inclusive, for example between 20 nm and 500 nm inclusive, for instance between 30 nm and 200 nm or between 50 nm and 200 nm. The current spreading layer may be configured to be at least 2 times, 5 times, 10 times or 20 times as thick as the terminal layer.

The terminal layer and the current spreading layer may differ in their material composition. It is possible for both the terminal layer and the current spreading layer to adjoin the semiconductor layer. A contact resistance between the semiconductor body and the terminal layer may be greater than a contact resistance between the semiconductor body and the current spreading layer.

According to at least one embodiment of the method or of the semiconductor chip, the terminal layer or the current spreading layer comprises at least one opening, in particular a common opening, the metal layer being electrically connected through the at least one opening to the second semiconductor layer. Further electrically conductive layers, for instance the through-contact or an n-side current spreading layer, may be arranged in the at least one opening. It is possible for the metal layer to extend partially into the at least one opening. The terminal layer and the current spreading layer may comprise a multiplicity of such openings, in particular such common openings.

According to at least one embodiment of the method or of the semiconductor chip, the insulation layer comprises a planarized surface facing away from the semiconductor body. The planarized surface is formed in particular in regions by a surface of one sublayer and in regions by a surface of a further sublayer of the insulation layer. The first sublayer and the second sublayer may be configured in respect of their material composition in such a way that the sublayers differ in respect of their etching selectivity, etching rate, polishing rate, breaking strength and/or mechanical hardness. For example, the sublayer is formed from an oxide material. The further sublayer may be formed from a nitride material. The planarized surface of the insulation layer may comprise an oxide surface in regions and a nitride surface in regions.

According to at least one embodiment of the method or of the semiconductor chip, the semiconductor chip comprises a first contact layer and a second contact layer for external electrical contacting. The first contact layer and the second contact layer may respectively comprise a freely accessible surface. For example, the first contact layer is electrically conductively connected to the terminal layer and/or to the current spreading layer, the second contact layer being electrically conductively connected to the metal layer. In a non-limiting embodiment, the first and second contact layers are arranged on the same edge surface of the semiconductor chip. In other words, the first contact layer and the second contact layer are arranged on the same lateral edge of the semiconductor chip, so that the semiconductor chip is externally electrically contactable via the contact layers of the same edge side. The other edge surfaces of the semiconductor chip may be free of such contact layers. A plurality of such semiconductor chips, which are electrically contactable from the same edge side, may be arranged in a row with one another.

According to at least one embodiment of the method or of the semiconductor chip, the semiconductor chip comprises a carrier, in particular an electrically insulating carrier. The metal layer is, in particular, arranged between the carrier and the semiconductor body. The contact layers may be arranged laterally with respect to the semiconductor body on a surface, facing away from the carrier, of the metal layer or of the insulation layer.

BRIEF DESCRIPTION OF THE DRAWINGS

Further advantages, non-limiting embodiments and refinements of the semiconductor chip and of the method may be found from the various embodiments explained below in connection with the FIGS. 1 to 4B, in which:

FIGS. 1A, 1B, 1C, 1D, 1E, 1F, 1G, 1H, 1I, 1J, 1K, 1L, 1M, 1N, 1O, 1P and 1Q show schematic representations of some method steps of one exemplary embodiment of a method for producing a multiplicity of semiconductor chips and schematic representations of one exemplary embodiment of a semiconductor chip, FIGS. 2A, 2B, 3A and 3B show schematic representations of further method steps of one exemplary embodiment of a further method for producing one or a multiplicity of semiconductor chips, and FIGS. 4A and 4B show a further exemplary embodiment of a semiconductor chip in a schematic sectional view and in a plan view, respectively.

Figure 1I:
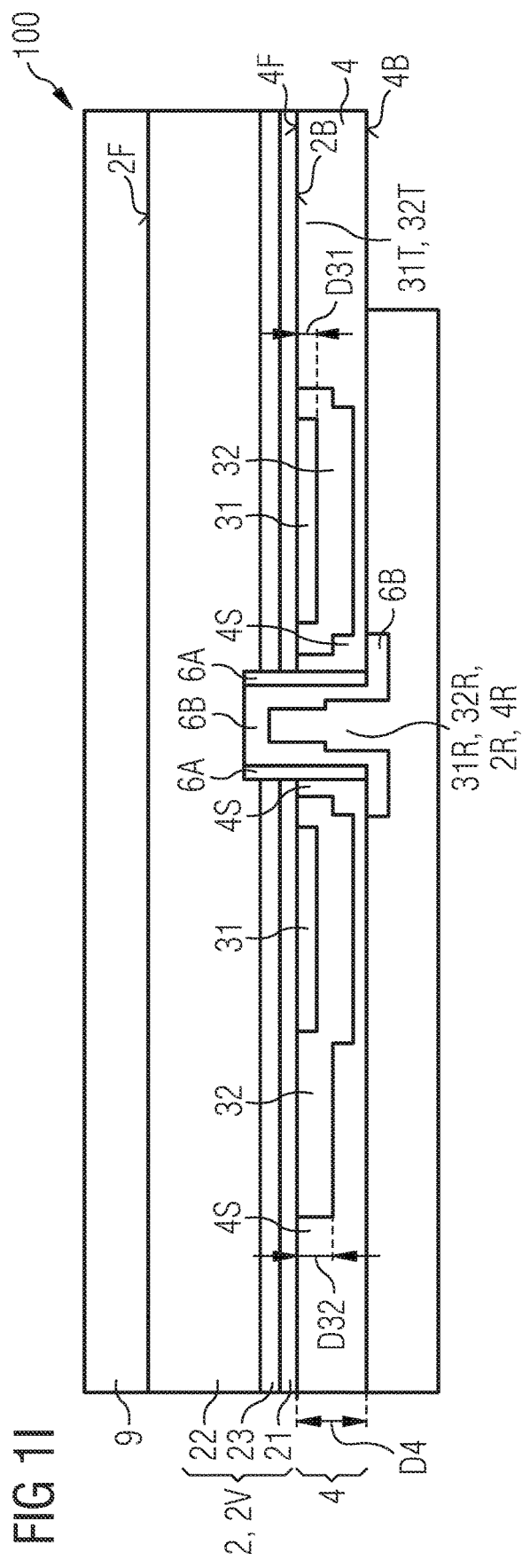

Elements which are the same or of the same type, or which have the same effect, are provided with the same references in the figures. The figures are respectively schematic representations and therefore not necessarily true to scale. Rather, relatively small elements, and in particular layer thicknesses, may be represented exaggeratedly large for illustration.

DETAILED DESCRIPTION

FIG. 1A represents a wafer panel 100 having a semiconductor body panel 2V. The semiconductor body panel 2V is arranged on a substrate 9. The substrate 9 may be a growth substrate, for instance a sapphire substrate. The semiconductor body panel 2V may be divided into a multiplicity of semiconductor bodies 2. In particular, the semiconductor body panel 2V or the semiconductor body 2 is deposited layerwise by means of an epitaxy method onto the substrate 9. It is possible for the substrate 9 to be different than a growth substrate.

The semiconductor body 2 may be formed from a III/V or II/VI compound semiconductor material. A III/V compound semiconductor material comprises an element from the third main group and an element from the fifth main group. A II/VI compound semiconductor material comprises an element from the second main group and an element from the sixth main group. For example, the semiconductor body 2 is based on GaN, InGaN or InAlP.

The semiconductor body panel 2V or the semiconductor body 2 comprises a first semiconductor layer 21 facing away from the substrate 9 and a second semiconductor layer 22 facing the substrate 9. For example, the first semiconductor layer 21 is configured to be p-conductive and the second semiconductor layer is configured to be n-conductive, or vice versa. The semiconductor body 2 comprises an active zone 23, which is arranged in the vertical Z direction between the first semiconductor layer 21 and the second semiconductor layer 22. In particular, the active zone 23 is adapted for emission or detection of electromagnetic radiation, for instance in the visible, ultraviolet or in the infrared spectral range.

The semiconductor body panel 2V or the semiconductor body 2 comprises a first back-side main surface 2B facing away from the substrate 9 and a second front-side main surface 2F facing toward the substrate 9 in a lateral XY plane. The first main surface 2B and the second main surface 2F are, for instance, formed by a surface of the first semiconductor layer 21 and by a surface of the second semiconductor layer 22, respectively.

For electrical contacting of the first semiconductor layer 21, a terminal layer 31 or a terminal layer panel 31V is applied onto the first main surface 2B. For example, a vertical layer thickness D31 of the terminal layer 31 of the terminal layer panel 31V is at least 20 nm, 30 nm, 50 nm, for instance between 20 nm and 300 nm inclusive.

The terminal layer panel 31V may be configured in such a way that it is initially configured to be continuous and subsequently—for instance as represented in FIG. 1B—divided into a multiplicity of terminal layers 31, for example by means of an etching process. As an alternative, it is possible for the terminal layers 31 to be applied in a structured fashion as spatially separated terminal layers onto the first main surface 2B. To this end, a mask, which for instance is formed from a photostructurable material, may be used.

The terminal layer 31 may indirectly or directly adjoin the semiconductor body 2 associated with it, in particular the first semiconductor layer 21. The terminal layer 31 is formed from an electrically conductive and highly reflective material, for instance a metal such as silver or aluminum. The terminal layer may be configured as a mirror layer. The terminal layer may comprise an electrically conductive oxide, for instance ZnO. The terminal layer may be formed from a layer sequence of metal layers and conductive oxide layers.

Figure 2A:
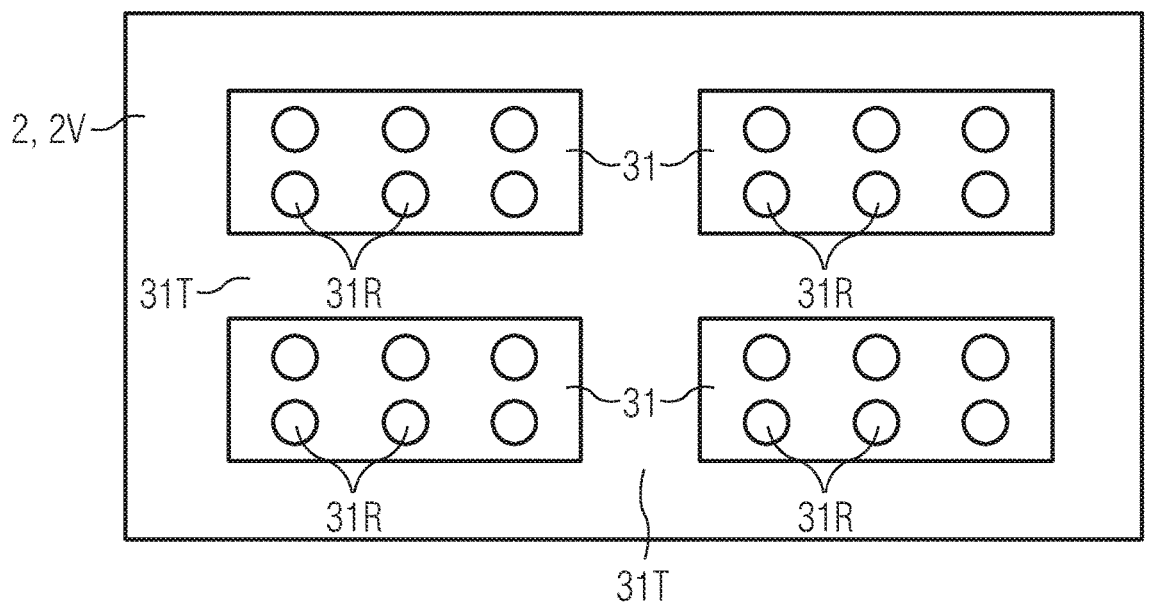
Figure 2B:
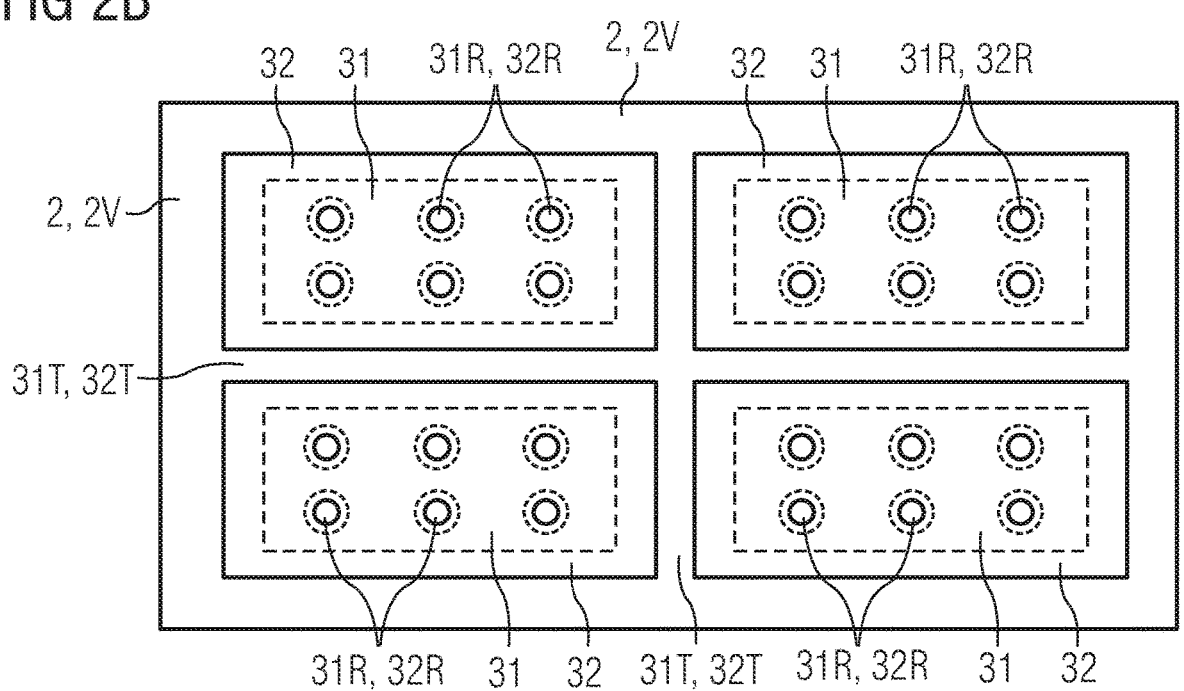

In particular, the terminal layers 31, for instance represented in FIG. 1B, 2A or 2B, may be spatially separated along a lateral direction by separating trenches 31T. Along the separating trenches 31T, the semiconductor body panel 2V may be separated into a multiplicity of semiconductor bodies 2, each having a terminal layer 31. In a non-limiting embodiment, the terminal layers 31 are respectively assigned to a semiconductor chip 10 to be produced. Each terminal layer 31 may comprise one or more openings 31R, through which a through-contact structure 60 for electrical contacting of the second semiconductor layer 22 is fed.

According to FIG. 1C, a current spreading layer 32 is applied onto the respective terminal layer 31. The current spreading layers 32 may respectively cover one of the terminal layers 31 fully. The current spreading layer 32 may adjoin the semiconductor body 2 in regions. The terminal layer 31 is arranged in the vertical direction between the semiconductor body 2 and the current spreading layer 32, and is enclosed in the lateral directions in particular by the current spreading layer 32, in particular enclosed in full scope. In a similar way to the terminal layers 31, openings 32R may be formed inside a current spreading layer 32 and/or separating trenches 32R between neighboring current spreading layers 32.

The first semiconductor layer 21 is configured on the p-side and/or to be p-conductive. A p-side semiconductor layer generally has a lower transverse conductivity than an n-side semiconductor layer. In order to achieve effective current injection into the first semiconductor layer and a homogeneous current distribution in the first semiconductor layer, it is expedient to configure the current spreading layer 32 to be sufficiently thick. For example, a vertical layer thickness D32 of the current spreading layer is at least 500 nm, 700 nm, 900 nm, 1 µm, 1.5 µm or at least 2 µm.

FIG. 2B represents such current spreading layers 32 and terminal layers 31 schematically in a plan view. The openings 31R and 32R or the separating trenches 31T and 32T form, in particular, common openings or common separating trenches of the terminal layers 31 and of the current spreading layers 32, respectively. Each current spreading layer 32 is, in particular, assigned to precisely one of the terminal layers 31, and vice versa. Each of the current spreading layers 32 or each of the terminal layers 31 may comprise more than 3, more than 6 or more than 10 such openings 31R and 32R.

The current spreading layer 32 may be formed from a metal, for instance titanium, copper, nickel, gold, platinum, aluminum or silver. In particular, the terminal layer 31 and the current spreading layer 32 differ in their material composition. The terminal layer 31 may be different than gold and/or platinum. It is possible for the layer thicknesses D31 and D32 to differ by at least 30%, 50%, 100%, 200% or 500% from one another. In a non-limiting embodiment, the terminal layer 31 has a lower layer thickness than the current spreading layer 32.

According to FIG. 1D, an insulation layer 4 is formed on the terminal layers 31 and/or current spreading layers 32. The insulation layer 4 may fill, in particular fully fill, the common separating trenches 31T and 32T as well as the common openings 31R and 32R. The insulation layer 4 may adjoin the semiconductor body 2 in regions, for example in the regions of the separating trenches 31T and 32T and/or the openings 31R and 32R. The insulation layer 4 may be configured as one layer or as a plurality of layers. For example, the insulation layer is formed from an electrically insulating material, for instance from an oxide such as silicon oxide, and/or from a nitride such as silicon nitride. The insulation layer 4 has a vertical layer thickness D4 which, in particular, is greater than the layer thicknesses D31 and D32, for example greater by at least 30%, 50%, 100%, 200% or 300%.

The terminal layers 31 and/or the current spreading layers 32 are overmolded by the insulation layer 4 in such a way that the insulation layer 4 replicates on its front side and/or on its back side a contour of the terminal layers 31 and/or of the current spreading layers 32. Except for the step overmoldings, the insulation layer 4 may have a constant vertical layer thickness D4 within the scope of production tolerances. For example, the insulation layer 4 is applied by means of a coating method, for instance surface-wide, onto the terminal layers 31 and/or the current spreading layers 32 as well as onto the semiconductor body 2 or the semiconductor body panel 2V.

The insulation layer 4 comprises a back-side surface 4B facing away from the semiconductor body 2 and a front-side surface 4F facing toward the semiconductor body 2. The front-side surface 4F and/or the back-side surface 4B may comprise vertical steps 4S or elevations 4S. These are attributable to the terminal layers 31 and/or the current spreading layers 32, which are formed as local elevations on the back-side main surface 2B of the semiconductor body 2.

The vertical steps 4S or elevations 4S may have the same vertical height as the layer thickness D31 of the terminal layer 31 or the layer thickness D32 of the current spreading layer, or as the sum of the two layer thicknesses D31 and D32.

According to FIG. 1E, the back-side surface 4B of the insulation layer 4 is levelled, such as by means of a chemical-mechanical planarization process. In particular, the terminal layers 31 and/or the current spreading layers 32 are furthermore covered fully by the insulation layer 4. Even after the planarization, the insulation layer 4 may be configured to be continuous. For example, the maximum layer thickness D4 of the insulation layer 4 after the planarization differs at most by 80%, 50%, 30%, 20% or by at most 10% from the sum of the layer thickness D31 of the terminal layer 31 and the layer thickness D32 of the current spreading layer 32. Further method steps, for instance the formation of further layers on the planarized back-side surface 4B of the insulation layer 4, may be carried out in a simplified way. The insulation layer 4 is in this sense used as internal planarization layer of the semiconductor chip 10 to be produced.

It is possible for the insulation layer 4 to be configured as a plurality of layers. For example, the insulation layer 4 may comprise a multiplicity of sublayers 41, 42 and 43, which are represented for instance in FIG. 3A. According to FIG. 3A, the insulation layer 4 comprises a first sublayer 41, a second sublayer 42 and a third sublayer 43. The back-side surface 4B of the insulation layer 4 may be formed by a surface of the third sublayer 43. The second sublayer 42 is, in particular, arranged in the vertical direction between the first sublayer 41 and the third sublayer 43. In a non-limiting embodiment, the second sublayer 42 is configured in respect of its material selection in relation to the third sublayer 43 in such a way that the second sublayer 42 acts as a stop layer during the planarization of the back-side surface 4B of the insulation layer 4. The first sublayer 41 and the third sublayer 43 may be formed from the same material or from different materials.

For example, the second sublayer 42 is formed from a nitride, for instance from $Si_3N_4$. The first sublayer 41 may be formed from an oxide, for instance from $SiO_2$. It has been found that a ratio of the polishing rate of an $Si_3N_4$ layer to the polishing rate of an $SiO_2$ layer, or a ratio of the etching rate of the $Si_3N_4$ layer to the etching rate of an $SiO_2$ layer, during a grinding process or during a chemical-mechanical planarization process, is about 1 to 20. In other words, the $Si_3N_4$ layer can be removed much more rapidly than the $SiO_2$ layer. Because of this selectivity, the torque of a grinding head may vary so greatly in the system regulation that the system may be regulated to stop the grinding process or polishing process in the second sublayer 42 or on the second sublayer 42.

A leveled or planarized back-side surface 4B of the insulation layer 4 is represented for instance in FIG. 3B. The planarized back-side surface 4B comprises both regions which are formed by surfaces of the second sublayer 42 and regions which are formed by surfaces of the third sublayer 43. The planarized back-side surface 4B may therefore be an oxide-nitride surface. The wafer panel 100 may be polished or ground to be so smooth that the back-side surface 4B may have an average roughness of less than 100 nm, 50 nm, 30 nm, 10 nm or less than 5 nm, the insulation layer 4 at the same time having a particularly low layer thickness D4, all the steps on the back side being overmolded and at the same time leveled.

The sublayers 41, 42 and 43 of the insulation layers may be formed surface-wide by means of a coating method on the back-side main surface 2B of the semiconductor body 2 or of the semiconductor body panel 2V. The sublayers 41, 42 and 43 may, except for the edge overmoldings, respectively have a constant layer thickness within the scope of production tolerances. The second sublayer 42 has a vertical layer thickness D42. The third sublayer 43, the surface of which may form the back-side surface 4B of the insulation layer 4, has a vertical layer thickness 43.

In particular, the layer thickness D43 is greater than the layer thickness D42, in particular at least 1.5 times, 2 times, 3 times or at least 5 times as great as the layer thickness D42. A ratio of the layer thickness D43 to the layer thickness D42 may be between 1 and 20 inclusive, or between 1 and 10 inclusive.

FIGS. 1F, 1G and 1H schematically represent some method steps for the formation of a through-contact structure 60. In the regions of the openings 31R and 32R of the terminal layer 31 and of the current spreading layer 32, an opening 2R or 4R is formed through the insulation layer 4 into the semiconductor body 2. The opening 4R of the insulation layer or the opening 2R of the semiconductor body may extend through the, in particular configured to be continuous, terminal layer 31 and/or current spreading layer 32 of a semiconductor chip 10 to be produced. In particular, the opening 4R or 2R extends through the first semiconductor layer 21 and the active zone 23 into the second semiconductor layer 22 (FIG. 1F). In order to form the opening 2R or 4R, a mask 11 may be used, for instance a first mask of a resist layer, the mask 11 comprising windows at the openings 2R or 4R to be formed.

According to FIG. 1G, a passivation layer 6A is formed inside the opening 2R or 4R in such a way that it covers, in particular fully covers, side walls of the opening 2R or 4R. A through-contact 6B for electrical contacting of the second semiconductor layer 22 may be formed in the opening 2R or 4R, the through-contact 6B being electrically insulated by the passivation layer 6A from the terminal layer 31, the current spreading layer 32, the first semiconductor layer 21 and the active zone 23 (FIG. 1H). The through-contact 6B extends, in particular, from the back-side surface 4B of the insulation layer 4 as far as the second semiconductor layer 22. The opening 2R or 4R may be partially or fully filled by the through-contact 6B. The through-contact 6B may partially cover the back-side surface 4B of the insulation layer 4.

For example, the through-contact 6B is applied onto the back-side surface 4B, or introduced into the opening 2R or 4R, by means of a coating method, for instance by means of sputtering. The through-contact 6B may be formed from an electrically conductive material, for instance metal such as silver. A multiplicity of such through-contacts 6B, which are assigned to the same semiconductor body 2, may be formed. After the formation of the passivation layer 6A and/or of the through-contact 6B, the first mask 11 may be removed.

Figure 1J:
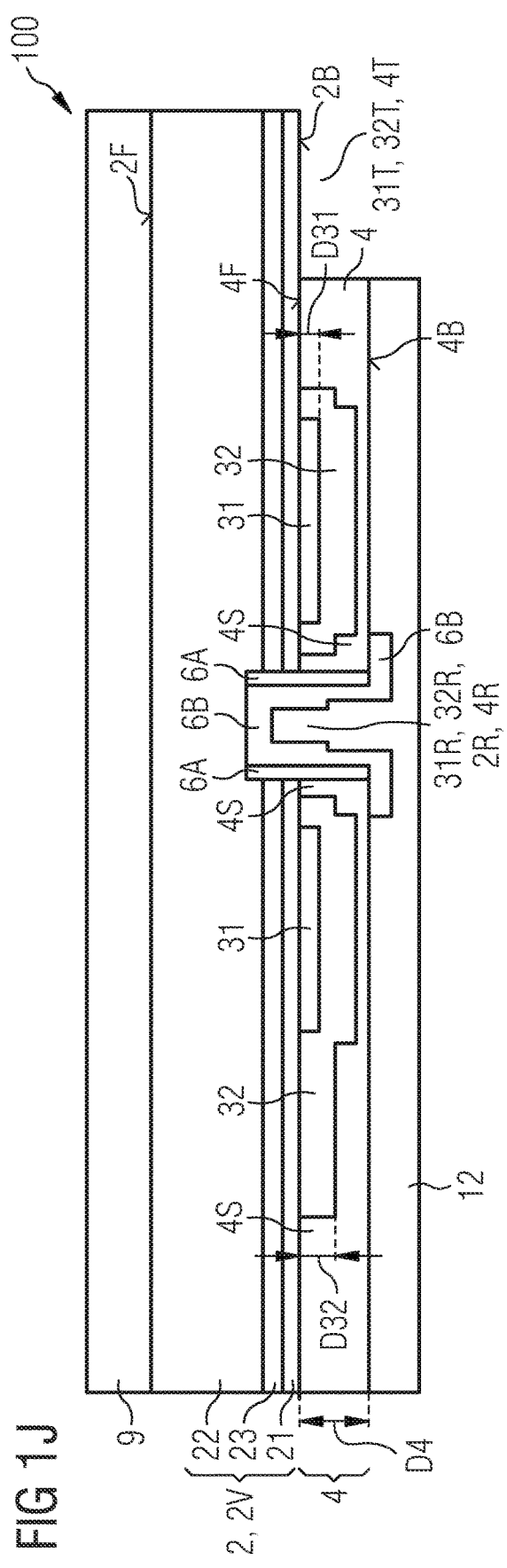

According to FIGS. 1I and 1J, at least one separating trench or a multiplicity of separating trenches 31T, 32T and 4T are formed. The separating trench 31T, 32T and 4T defines, in particular, a boundary between neighboring semiconductor bodies 2 or between rows or columns of the semiconductor bodies 2 of the semiconductor chips 10 to be produced. The separating trench or the separating trenches 31T, 32T and 4T may be formed by removal of the insulation layer 4 in regions, for example by means of a wet and/or dry chemical etching process. The metal layer 5 is in particular dry-chemically opened. Subsequently, wet chemical etching may be carried out as far as the first semiconductor layer 21. For the formation of the separating trenches 4T, a further mask 12 may be used, for instance a second mask 12, in particular formed from a resist layer (FIG. 1I). It is possible for such separating trenches 31T, 32T and 4T to extend through the insulation layer 4, so that the back-side main surface 2B of the semiconductor body 2 is exposed or uncovered in the region of the separating trench 4T of the insulation layer 4. After the formation of the separating trench 4T, the second mask 12 may be removed. It is possible for a multiplicity of such separating trenches 4T of the insulation layer 4 to be formed. The semiconductor body panel 2V may be divided into a multiplicity of semiconductor bodies 2 along the separating trenches 4.

FIG. 1K schematically represents a method step for the formation of a metal layer 5 on the semiconductor body 2, or on the semiconductor body panel 2V. The metal layer 5 may be formed from a metal such as copper and/or from a metal such as nickel. In FIG. 1K, an intermediate layer 6D is arranged between the through-contacts 6B and the metal layer 5. The intermediate layer 6D is in particular configured to be electrically conductive, and for instance provides an electrical contact between the through-contacts 6B and the metal layer 5. The intermediate layer 6D may fully cover the back-side main surface 2B of the semiconductor body 2.

According to FIG. 1K, the semiconductor body 2 may be temporarily short-circuited by the intermediate layer 6D. This short circuit may be eliminated in a subsequent method step, for instance by structuring the semiconductor body 2, in particular by regions of the semiconductor body 2 which lie in the regions of the separating trenches 4T and are in direct electrical contact with the intermediate layer 6D being removed, for instance by material ablation. In contrast to FIG. 1K, it is possible for a thin sublayer of the insulation layer 4 to be present between the semiconductor body 2 and the intermediate layer 6D in the regions of the separating trenches 4T. In this case, the intermediate layer 6D is electrically insulated from the first semiconductor layer 21. The intermediate layer 6D may, however, also be optional.

The metal layer 5 is applied by means of a coating method onto the intermediate layer 6D and/or onto the back-side main surface 2B of the semiconductor body 2, for example surface-wide by means of an electroplating process. The metal layer 5 comprises a back-side surface 5B facing away from the semiconductor body 2 and a front-side surface 5F facing toward the semiconductor body 2.

In particular, the through-contact structures 60, the separating trenches 4T of the insulation layer 4 and/or the intermediate layer 6D may be overmolded by the metal layer 5. The metal layer 5 may extend in regions into the opening or openings 2R, 4R, 31R and 32R and/or into the separating trenches 4T and fill them, in particular fill them fully. Except for the edge overmoldings the metal layer 5 may have a constant vertical layer thickness within the scope of production tolerances. Immediately after the formation of the metal layer 5, the back-side surface 5B and/or the front-side surface 5F of the metal layer 5 may comprise steps 5S and/or local vertical elevations. The steps 5S and/or the local elevations may have a vertical height which is in particular greater than 500 nm, 1 µm, 1.5 µm or greater than 2 µm, for example between 500 nm and 5 µm inclusive, or between 500 nm and 3 µm inclusive.

According to FIG. 1L, the metal layer 5, in particular the back-side surface 5B of the metal layer 5 is leveled or planarized, for example by means of a grinding process and/or by means of a chemical-mechanical planarization process. After the planarization, the back-side surface 5B of the metal layer 5 may have an average roughness which is at most 300 nm, 200 nm, 100 nm, 50 nm, 30 nm, 20 nm or at most 10 nm. The back-side surface 5B of the metal layer 5 is therefore configured to be level and may be free of steps 5S and/or vertical elevations. After the planarization, the metal layer 5 may have a vertical layer thickness which is at least in regions greater than the layer thickness D31, D32 and/or D4 or greater than the sum of at least two or all of these layer thicknesses D31, D32 and D4. It is possible for only the metal layer 5 to be planarized. In this case, it may not be necessary for the insulation layer 5 to be leveled or planarized beforehand die.

Figure 1M:
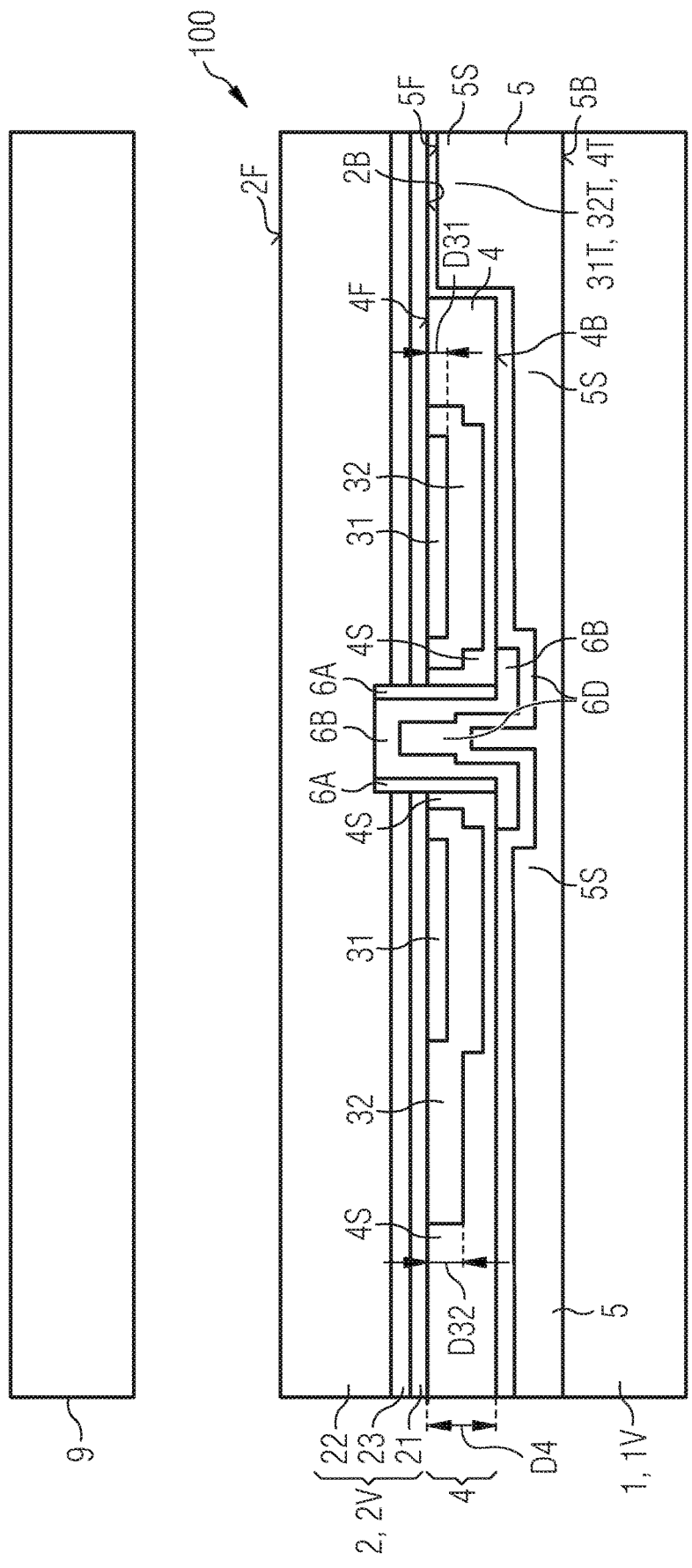

According to FIG. 1M, the wafer panel 100 or the semiconductor body 2 is mechanically connected on the back-side surface 5B of the metal layer 5 to a carrier 1 or to a carrier panel 1V. The carrier 1 or the carrier panel 1V may be configured to be electrically conductive or electrically insulating, and may for example be formed from a metal or from a ceramic material, such as $Si_3N_4$ or AlN. The back-side surface 5B of the metal layer 5 may be planarized in such a way that the wafer panel 100 or the semiconductor body 2 is mechanically connected by means of a direct bonding method to the carrier 1 or to the carrier panel 1V. The metal layer 5 may directly adjoin the carrier 1 or the carrier panel 1V. There is in particular no connecting layer, for instance no adhesive layer or no bonding layer between the metal layer 5 and the carrier 1 or the carrier panel 1V. As an alternative, it is possible for the wafer panel 100 to be mechanically fixed to the carrier 1 or to the carrier panel 1V by means of a connecting layer 80, for instance an adhesive layer or a soldered layer (FIG. 4A). By the planarization of the metal layer 5, bending of the wafer panel 100 may be avoided or minimized because of reduced internal thermo-mechanical stresses between the semiconductor body panel 2V, the substrate 9 and the carrier 1. The number of possible cavities inside the connecting layer may also be minimized. There is a relatively large choice of materials for the carrier 1.

The level back-side surface 5B of the metal layer 5 may in the case of conventional bonding processes, for example in the case of soldering with AuSn, AuInSn or NiInSn, lead to an improved quality of the connecting layer 80 with fewer cavities and therefore fewer adhesion problems between the wafer panel 100 and the metal layer 5. Subsequent process steps for producing the semiconductor chip 10 or the multiplicity of semiconductor chips 10 may thereby be simplified. Additional improvements, for instance in relation to the forward voltage, may be achieved. Compressions or expansions of the wafer panel 100, which are caused by different expansion coefficients of the carrier 1 and of the metal layer 5 or of the semiconductor body 2, may be avoided. This leads to an improved productivity in the production of the semiconductor chips 10.

According to FIG. 1M, the substrate 9 is removed from the semiconductor body 2 or from the semiconductor body panel 2V, for example by means of a chemical and/or mechanical process or by means of a laser liftoff process. After the detachment of the substrate 9, the front-side main surface 2F of the semiconductor body 2 or of the semiconductor body panel 2V may be exposed. The front-side main surface 2F may be structured, for instance, in order to increase the light output.

Figure 1N:
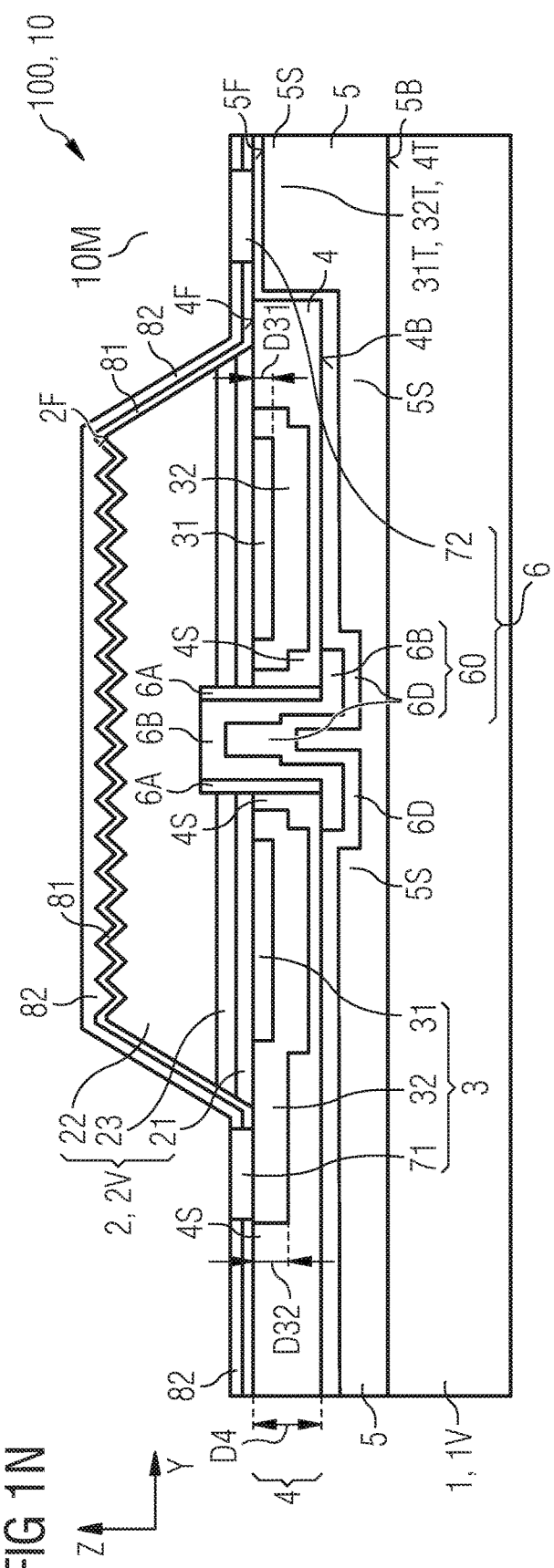

The semiconductor body panel 2V is structured according to FIG. 1N into a multiplicity of semiconductor bodies 2. The structuring is carried out, in particular, in the regions of the semiconductor body panel 2V which, in a plan view of the front-side main surface 2F, cover the separating trenches 31T, 32T and/or 4T located underneath. Expediently, the semiconductor body panel 2V is structured in such a way that possible direct electrical contact between the first semiconductor layer 21 and the intermediate layer 6D or the metal layer 5 is eliminated.

Mesa trenches 10M may be formed between the neighboring semiconductor bodies 2, the insulation layer 4, the current spreading layer 32, the intermediate layer 6D and/or the metal layer 5 being exposed in regions. For example, the insulation layer 4 and the current spreading layer 32 may be exposed in regions in a common mesa trench 10M. A first contact layer 71 or a multiplicity of first contact layers 71 may be formed on the exposed surface of the current spreading layer 32. The insulation layer 4 and/or the intermediate layer 6D and/or the metal layer 5 may be exposed in regions in a further mesa trench 10M. A second contact layer 72 or a multiplicity of second contact layers 72 may be formed on the exposed surface of the intermediate layer 6D or of the metal layer 5. In a non-limiting embodiment, each semiconductor body 2 is assigned a first contact layer 71 and a second contact layer 72. In particular, the semiconductor body 2 or the semiconductor chip 10 is externally electrically contactable by means of the first contact layer 71 and the second contact layer 72. For example, the contact layers 71 and 72 respectively comprise a freely accessible surface.

It is possible for the insulation layer 4, the current spreading layer 32 and the intermediate layer 6D or the metal layer 5 to be exposed in regions in a common mesa trench 10M. The first contact layer 71 and the second contact layer 72, laterally separated from the first contact layer 71, may be formed in a common mesa trench 10M. A multiplicity of first contact layers 71 and a multiplicity of second contact layers 72 may also be formed in the same mesa trench 10M. After the division of the wafer panel 100 into a multiplicity of semiconductor chips 10, the first contact layer 71 and the second contact layer 72 may be arranged on the same edge surface 10E of the associated semiconductor chip 10 (FIG. 1Q). In other words, the contact layers 71 and 72 are not arranged on different edge surfaces of the semiconductor chip 10, for instance on aligned or opposite edge surfaces of the semiconductor chip 10. Except for the one edge surface 10E, the semiconductor chip 10 may be free of further contact layers for external electrical contacting of the semiconductor chip 10.

In FIG. 1N, the semiconductor body 2, in particular each semiconductor body 2, comprises oblique side surfaces. For example, the side surface of the semiconductor chip 2 makes an acute angle with the back-side main surface 2B of the semiconductor body 2 of between 10° and 80° inclusive, or between 20° and 70° inclusive, or between 30° and 60° inclusive. A first cover layer 81 and/or a second cover layer 82 may be applied onto the side surfaces and the front-side main surface 2F of the semiconductor body 2. The first cover layer 81 is located, for instance, between the front-side main surface 2F and the second cover layer 82. For example, the first cover layer 81 is an $Al_2O_3$ layer, which is applied by means of atomic layer deposition, in particular directly, onto the roughened front-side main surface 2F. The second cover layer 82 may be an insulating layer, for instance made of silicon oxide or of silicon nitride or of aluminum oxide, such as $Al_2O_3$. It is possible for the second cover layer 82 to contain scattering particles and/or luminescent particles.

The first cover layer 81 and/or the second cover layer 82 may fully cover the semiconductor body 2 and/or the mesa trenches 10M. In order to form the first contact layer 71 and/or the second contact layer 72, the first cover layer 81 and/or the second cover layer 82 may be opened in regions, for instance laterally with respect to the semiconductor body 2, for example by means of an etching process with HF. The first contact layer 71 and/or the second contact layer 72 is/are located in particular laterally with respect to the semiconductor body 2, for instance on the same vertical plane as the back-side main surface 2B of the semiconductor body 2. In particular, the contact layers 71 and 72 are electrically contactable from above, i.e. from the front-side main surface 2F of the semiconductor body 2.

Figure 1O:
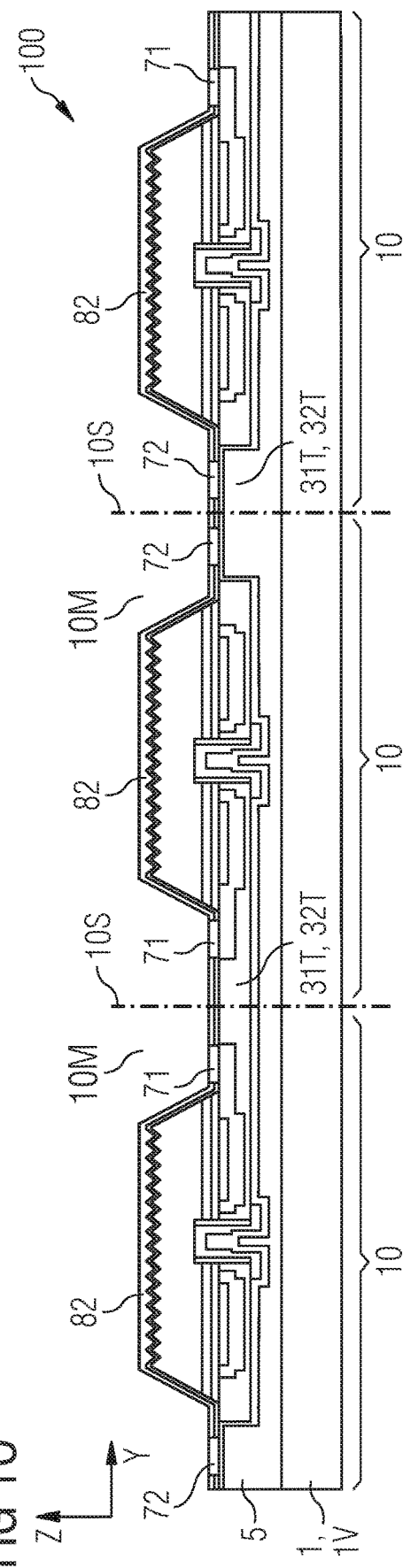

The semiconductor bodies 2 are separated from one another, in particular laterally, by the mesa trenches 10M. According to FIG. 1O, the wafer panel 100 may be divided in the regions of the mesa trenches 10M along the separating lines 10S into a multiplicity of semiconductor chips 10. The separating lines 10S extend in particular through the carrier panel 1V, the insulation layer 4 and/or through the metal layer 5. It is possible for some of the separating lines 10S not to extend through the insulation layer 4.

The divided semiconductor chips 10 respectively comprise a carrier 1 from the carrier panel 1V, a semiconductor body 2 from the semiconductor body panel 2V, an insulation layer 4, a first electrode 3 having an in particular continuous terminal layer 31 and an in particular continuous current spreading layer 32, and a second electrode 6 having a metal layer 5 and at least one or a multiplicity of through-contact structures 60, the first electrode 3 being electrically insulated from the second electrode 6 by the insulation layer 4. In particular, the semiconductor chip 10 is an LED, for instance a high current LED. The insulation layer 4 and/or the metal layer 5 may in particular be configured to be continuous, and has/have in particular a planarized back-side surface 4B and/or 5B facing away from the semiconductor body 2. Such a semiconductor chip 10 is schematically represented, for instance, in FIGS. 1P and 1Q.

FIG. 1P represents the semiconductor chip 10 along a section surface VV' shown in FIG. 1Q in a sectional view. The semiconductor chip 10 comprises a heat sink 1H or a solder layer 1H on its back side. The semiconductor chip 10 is represented schematically in a plan view in FIG. 1Q. The semiconductor chip 10 may comprise contact connections 70, which are electrically connected to the first contact layer 71 or to the second contact layer 72 and are adapted for external electrical contacting of the semiconductor chip 10.

The contact layers 71 and 72 are arranged on the same edge surface 10E of the semiconductor chip 10. The further edge surfaces of the semiconductor chip 10 are, in particular, free of contact layers or electrical terminal locations. The semiconductor chip 10 comprises a multiplicity of through-contact structures 60, for instance at least 5, 10, 20 or 30, for example between 5 and 150 inclusive, the through-contact structures 60 in particular being arranged uniformly in the semiconductor body 2. Since the contact layers 71 and 72 are located on the same edge surface 10E of the semiconductor chip 10, in order to achieve a uniform current distribution inside the entire semiconductor body 2 it is particularly expedient for the terminal layer 31 and/or the current spreading layer 32 to be configured to be sufficiently thick. In a non-limiting embodiment, the current spreading layer 32 has a minimum layer thickness of 500 nm, 700 nm, 900 nm, 1 µm, 1.5 µm or of 2 µm.

The exemplary embodiments of a semiconductor chip 10 represented in FIGS. 4A and 4B correspond substantially to the exemplary embodiments of a semiconductor chip 10 represented in FIGS. 1P and 1Q, respectively. In contrast thereto, the semiconductor chip 10 comprises a connecting layer 80 which is arranged between the carrier 1 and the metal layer 5, the connecting layer 80 being adapted for mechanical fixing of the semiconductor body 2 or of the metal layer 5 on the carrier 1.

This patent application claims the priority of German Patent Application 10 2017 123 242.7, the disclosure content of which is incorporated here by reference.

The description of the invention with the aid of the exemplary embodiments does not restrict the invention to these exemplary embodiments. Rather, the invention comprises any new feature and any combination of features, which includes in particular any combination of features in the claims, even if this feature or this combination is not itself explicitly indicated in the claims or the exemplary embodiments.

LIST OF REFERENCES 100 wafer panel
10 semiconductor chip
10E edge surface of the semiconductor chip
10M mesa trench of the wafer panel/semiconductor body panel
10S separating lines of the wafer panel
1 carrier
1V carrier panel
1H heat sink/solder layer
2 semiconductor body
2B back-side surface of the semiconductor body
2F front-side surface of the semiconductor body
2R opening of the semiconductor body
2V semiconductor body panel
21 first semiconductor layer
22 second semiconductor layer
23 active zone
3 first (p-side) electrode
31 terminal layer
31R opening of the terminal layer
31T separating trench of the terminal layers
31V terminal layer panel
32 (p-side) current spreading layer
32R opening of the current spreading layer
32T separating trench of the current spreading layers
4 insulation layer
4B back-side surface of the insulation layer
4F front-side surface of the insulation layer
4R opening of the insulation layer
4S steps/elevations of the insulation layer
4T separating trench of the insulation layer
41 (first) sublayer of the insulation layer
42 (second) further sublayer of the insulation layer
43 (third) sublayer of the insulation layer
5 metal layer
5B back-side surface of the metal layer
5F front-side surface of the metal layer
5S steps/elevations of the metal layer
6 second (n-side) electrode
60 through-contact structure
6A passivation layer
6B through-contact
6D intermediate layer
70 contact connection
71 first contact layer
72 second contact layer
80 connecting layer
81 first cover layer
82 second cover layer
9 substrate/growth substrate
11 first mask/first resist layer 12 second mask/second resist layer
D31 layer thickness of the terminal layer
D32 layer thickness of the current spreading layer
D4 layer thickness of the insulation layer
D42 layer thickness of the sublayer of the insulation layer
D43 layer thickness of the sublayer of the insulation layer

The invention claimed is:

1. A method for producing a semiconductor chip, wherein the method comprises:
   providing a semiconductor body having a first semiconductor layer, a second semiconductor layer, and an active zone arranged between the first semiconductor layer and the second semiconductor layer;
   forming a current spreading layer for electrical contacting of the first semiconductor layer, the current spreading layer having a vertical layer thickness of at least 500 nm;
   forming an insulation layer fully covering the current spreading layer; and
   forming a metal layer configured for electrical contacting of the second semiconductor layer and fully covering the current spreading layer;
   wherein:
   the insulation layer is arranged in the vertical direction between the metal layer and the current spreading layer, so that the metal layer is electrically insulated from the current spreading layer, and
   a surface, facing away from the semiconductor body, of the insulation layer or of the metal layer initially has steps, which are subsequently leveled;
   the insulation layer comprises a sublayer and a further sublayer, wherein the sublayer is arranged in the vertical direction between the semiconductor body and the further sublayer; and
   the sublayer and the further sublayer are configured in respect of their material composition in such a way that the sublayer is configured to be more etching-resistant and/or more polishing-resistant than the further sublayer.

2. The method as claimed in claim 1, wherein:
   a continuous semiconductor body panel divisible into a multiplicity of semiconductor bodies is provided;
   forming a current spreading layer comprises forming a multiplicity of the current spreading layers, the current spreading layers being laterally separated from one another;
   the insulation layer fully covers all of the current spreading layers; and
   the metal layer fully covers all of the current spreading layers;
   wherein:
   the metal layer is electrically insulated from the current spreading layers by the insulation layer; and
   the surface, facing away from the semiconductor body panel, of the insulation layer or of the metal layer is leveled before the division of the semiconductor body panel into a multiplicity of semiconductor bodies.

3. The method as claimed in claim 1, wherein the surface, facing away from the semiconductor body, of the insulation layer or of the metal layer is leveled by a chemical-mechanical planarization process.

4. The method as claimed in claim 1, wherein the surface, facing away from the semiconductor body, of the insulation layer and the surface, facing away from the semiconductor body, of the metal layer are leveled by a chemical-mechanical planarization process.

5. The method as claimed in claim 1, wherein the sublayer comprises a nitride, and the further sublayer comprises an oxide material.

6. The method as claimed in claim 1, wherein:
   the surface of the metal layer is planarized in such a way that it has an average roughness of at most 30 nm, and
   the metal layer is mechanically connected on its planarized surface to a carrier or to a carrier panel by a direct bonding method.

7. The method as claimed in claim 1, wherein:
   the surface, facing away from the semiconductor body, of the metal layer is planarized, and
   the metal layer is mechanically connected on its planarized surface to a carrier or to a carrier panel by a connecting layer.

8. A semiconductor chip comprising:
   a carrier; and
   a semiconductor body arranged thereon, wherein:
   the semiconductor body comprises a first semiconductor layer facing toward the carrier, a second semiconductor layer facing away from the carrier, and an active zone arranged between the first semiconductor layer and the second semiconductor layer;
   at least one current spreading layer configured for electrical contacting of the first semiconductor layer is arranged between the carrier and the semiconductor body, the current spreading layer having a vertical layer thickness of at least 500 nm;
   a metal layer for electrical contacting of the second semiconductor layer is arranged between the carrier and the current spreading layer, the metal layer fully covering the current spreading layer;
   an insulation layer is arranged in the vertical direction between the current spreading layer and the metal layer, the insulation layer fully covering the current spreading layer and electrically insulating the metal layer from the current spreading layer; and
   the insulation layer or the metal layer comprises a planarized surface facing away from the semiconductor body;
   the insulation layer comprises a sublayer and a further sublayer, wherein the sublayer is arranged in the vertical direction between the semiconductor body and the further sublayer; and
   the sublayer and the further sublayer are configured in respect of their material composition in such a way that the sublayer is configured to be more etching-resistant and/or more polishing-resistant than the further sublayer.

9. The semiconductor chip as claimed in claim 8, wherein:
   the insulation layer and/or the metal layer comprise/comprises a surface, facing toward the semiconductor body, having local vertical elevations.

10. The semiconductor chip as claimed in claim 8, wherein:
    for electrical contacting of the second semiconductor layer, a through-contact is configured in such a way that it is electrically connected to the metal layer and extends through the first semiconductor layer and the active zone into the second semiconductor layer.

11. The semiconductor chip as claimed in claim 10, wherein:

each semiconductor body is assigned a multiplicity of through-contacts electrically connected to one another by the metal layer.

12. The semiconductor chip as claimed in claim 10, wherein:

a terminal layer arranged between the current spreading layer and the semiconductor body, the current spreading layer being in electrical contact with the terminal layer and fully covering the terminal layer.

13. The semiconductor chip as claimed in claim 12, wherein:

the terminal layer or the current spreading layer comprises at least one opening, the metal layer being electrically connected through the at least one opening to the second semiconductor layer.

14. The semiconductor chip as claimed in claim 8, wherein:

the insulation layer comprises a planarized surface facing away from the semiconductor body;

the planarized surface arranged in regions by a surface of one sublayer and in regions by a surface of a further sublayer of the insulation layer;

the sublayer comprises an oxide material; and the further sublayer comprises a nitride material, so that the planarized surface of the insulation layer comprises an oxide surface in regions and a nitride surface in regions.

15. The semiconductor chip as claimed in claim 8, wherein the semiconductor chip comprises a first contact layer and a second contact layer for external electrical contacting;

the first contact layer and the second contact layer respectively comprising a freely accessible surface;

the first contact layer being electrically connected to the current spreading layer;

the second contact layer being electrically connected to the metal layer; and the first and second contact layers being arranged on the same edge surface of the semiconductor chip.

* * * * *